United States Patent
Ebihara et al.

(10) Patent No.: US 6,329,780 B1
(45) Date of Patent: *Dec. 11, 2001

(54) ELECTROMAGNETIC ALIGNMENT AND SCANNING APPARATUS

(75) Inventors: Akimitsu Ebihara, Kyoto-Fu (JP); Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/482,871

(22) Filed: Jan. 14, 2000

Related U.S. Application Data

(62) Division of application No. 09/260,544, filed on Mar. 2, 1999, now Pat. No. 6,246,204, which is a continuation-in-part of application No. 08/698,827, filed on Aug. 16, 1996, now abandoned, which is a continuation of application No. 08/266,999, filed on Jun. 27, 1994, now abandoned.

(30) Foreign Application Priority Data

Mar. 2, 1998 (JP) ................................... 10-49098

(51) Int. Cl.[7] .................................................. H01L 21/027
(52) U.S. Cl. ......................... 318/649; 318/653; 318/597
(58) Field of Search ................................ 318/567, 568.1, 318/568.11, 568.22, 590, 597, 647, 649, 652, 653, 654

(56) References Cited

U.S. PATENT DOCUMENTS

| | | |
|---|---|---|
| Re. 27,289 | 2/1972 | Sawyer . |
| Re. 27,436 | 7/1972 | Sawyer . |
| 3,789,285 | 1/1974 | Nishizawa . |
| 3,889,164 | 6/1975 | Nishizawa et al. . |
| 3,935,486 | 1/1976 | Nagashima . |
| 4,019,109 | 4/1977 | McCoy et al. . |
| 4,087,729 | 5/1978 | Yamazaki et al. . |
| 4,129,291 | 12/1978 | Kato et al. . |
| 4,234,175 | 11/1980 | Sato et al. . |
| 4,392,642 | 7/1983 | Chitayat . |

(List continued on next page.)

FOREIGN PATENT DOCUMENTS

| | | |
|---|---|---|
| A1-0 502 578 | 11/1992 | (EP) . |
| 2 288 277 | 10/1995 | (GB) . |
| 61-45988 | 3/1986 | (JP) . |

(List continued on next page.)

OTHER PUBLICATIONS

Buckley, Jere D., et al. "Step and Scan: A Systems Overview of a New Lithography Tool". The Perkin–Elmer Corporation, Connecticut Operations Sector, Norwalk, CT, SPIE, vol. 1088, *Laser Microlithopgraphy II* (1989), pp. 424–433.

(List continued on next page.)

*Primary Examiner*—Bentsu Ro
(74) *Attorney, Agent, or Firm*—Oliff & Berridge PLC

(57) ABSTRACT

An apparatus capable of high accuracy position and motion control utilizes one or more linear commutated motors to move a guideless stage in one long linear direction and small yaw rotation in a plane. A carrier/follower holding a single voice coil motor (VCM) is controlled to approximately follow the stage in the direction of the long linear motion. The VCM provides an electromagnetic force to move the stage for small displacements in the plane in a linear direction perpendicular to the direction of the long linear motion to ensure proper alignment. One element of the linear commutated motors is mounted on a freely suspended drive assembly frame which is moved by a reaction force to maintain the center of gravity of the apparatus. Where one linear motor is utilized, yaw correction can be achieved utilizing two VCMs.

27 Claims, 25 Drawing Sheets

U.S. PATENT DOCUMENTS

| | | |
|---|---|---|
| 4,409,860 | 10/1983 | Moriyama et al. . |
| 4,425,508 | 1/1984 | Lewis, Jr. et al. . |
| 5,120,034 | 6/1992 | Van Engelen et al. . |
| 5,150,153 | 9/1992 | Franken et al. . |
| 5,172,160 | 12/1992 | Van Eijk et al. . |
| 5,194,893 | 3/1993 | Nishi . |
| 5,208,497 | 5/1993 | Ishii et al. . |
| 5,228,358 | 7/1993 | Sakino et al. . |
| 5,229,670 | 7/1993 | Kagawa . |
| 5,241,183 | 8/1993 | Kanai et al. . |
| 5,243,491 | 9/1993 | Van Eijk et al. . |
| 5,280,677 | 1/1994 | Kybo et al. . |
| 5,285,142 | 2/1994 | Galburt et al. . |
| 5,315,526 | 5/1994 | Maeda et al. . |
| 5,327,060 | 7/1994 | Van Engelen et al. . |
| 5,338,121 | 8/1994 | Kobayashi et al. . |
| 5,473,410 | 12/1995 | Nishi . |
| 5,477,304 | 12/1995 | Nishi . |
| 5,504,407 | 4/1996 | Wakui et al. . |
| 5,528,118 * | 6/1996 | Lee .................................. 318/568.17 |
| 5,715,064 | 2/1998 | Lin . |
| 5,721,608 | 2/1998 | Taniguchi . |
| 5,744,924 | 4/1998 | Lee . |
| 5,796,469 | 8/1998 | Ebinuma . |
| 5,801,833 * | 9/1998 | Kobayashi et al. ................... 356/358 |
| 4,443,743 | 4/1984 | Forys et al. . |
| 4,485,339 | 11/1984 | Trost . |
| 4,492,356 | 1/1985 | Taniguchi et al. . |
| 4,504,144 | 3/1985 | Trost . |
| 4,506,204 | 3/1985 | Galburt . |
| 4,506,205 | 3/1985 | Trost et al. . |
| 4,507,597 | 3/1985 | Trost . |
| 4,514,858 | 4/1985 | Novak . |
| 4,516,253 | 5/1985 | Novak . |
| 4,525,659 | 6/1985 | Imahashi et al. . |
| 4,575,942 | 3/1986 | Moriyama . |
| 4,615,515 | 10/1986 | Suzuta et al. . |
| 4,628,238 | 12/1986 | Smulders et al. . |
| 4,630,942 | 12/1986 | Tsumaki et al. . |
| 4,641,071 | 2/1987 | Tazawa et al. . |
| 4,648,723 | 3/1987 | Sugiyama et al. . |
| 4,648,724 | 3/1987 | Sugiyama et al. . |
| 4,653,408 | 3/1987 | Nagashima et al. . |
| 4,654,571 | 3/1987 | Hinds . |
| 4,667,139 | 5/1987 | Hirai et al. . |
| 4,675,891 | 6/1987 | Plessis et al. . |
| 4,676,492 | 6/1987 | Shamir . |
| 4,677,651 | 6/1987 | Hartl et al. . |
| 4,684,315 | 8/1987 | Sugishima et al. . |
| 4,687,980 | 8/1987 | Phillips et al. . |
| 4,698,575 | 10/1987 | Bouwer . |
| 4,708,465 | 11/1987 | Isohata et al. . |
| 4,723,086 | 2/1988 | Leibovich et al. . |
| 4,742,286 | 5/1988 | Phillips . |
| 4,744,675 | 5/1988 | Sakino et al. . |
| 4,750,721 | 6/1988 | Sasada . |
| 4,770,531 | 9/1988 | Tanaka et al. . |
| 4,812,725 | 3/1989 | Chitayat . |
| 4,817,930 | 4/1989 | Van Deuren . |
| 4,870,668 | 9/1989 | Frankel et al. . |
| 4,879,482 | 11/1989 | Murofushi . |
| 4,887,804 | 12/1989 | Ohtsuka . |
| 4,916,340 | 4/1990 | Negishi . |
| 4,952,858 | 8/1990 | Galburt . |
| 4,993,696 | 2/1991 | Furukawa et al. . |
| 5,022,619 | 6/1991 | Mamada . |
| 5,031,547 | 7/1991 | Hirose . |
| 5,040,431 | 8/1991 | Sakino et al. . |
| 5,059,090 | 10/1991 | Bobroff et al. . |

FOREIGN PATENT DOCUMENTS

| | | |
|---|---|---|
| 3-21894 | 1/1991 | (JP) . |
| 63-20014 | 11/1994 | (JP) . |

OTHER PUBLICATIONS

Moriyama, et al., *"Precision X–Y Stage with a Piezo–driven Fine–table,"* The Bulletin of The Japan Society Precision Engineering, vol. 22, No. 1, pp. 13–17, Mar. 1988.

* cited by examiner

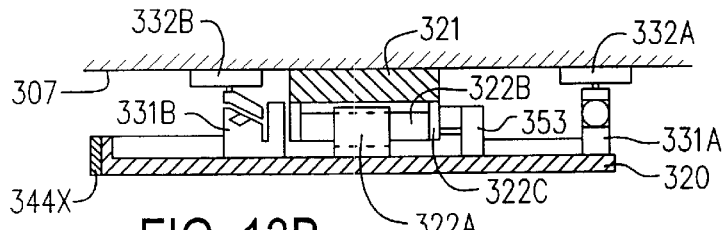
FIG. 13B
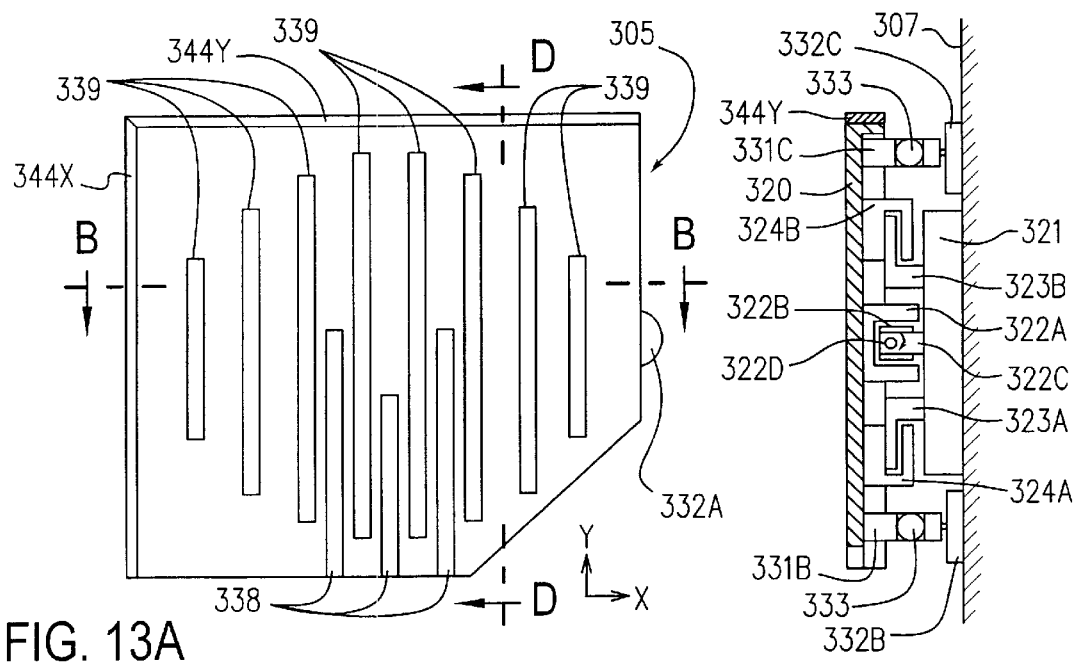
FIG. 13A
FIG. 13D
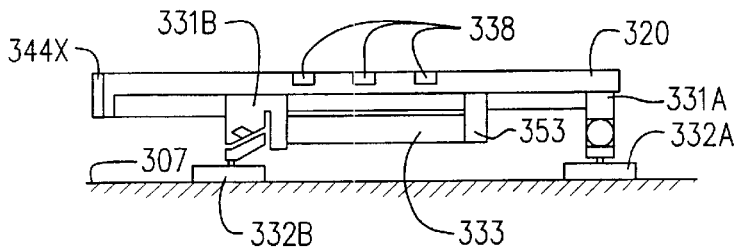
FIG. 13C

ELECTROMAGNETIC ALIGNMENT AND SCANNING APPARATUS

CROSS-REFERENCE TO RELATED APPLICATIONS

This is a Divisional of application Ser. No. 09/260,544, filed Mar. 2, 1999, now U.S. Pat. No. 6,246,204, which is a Continuation-in-Part of application Ser. No. 08/698,827 filed Aug. 16, 1996, abandoned, which in turn is a Continuation of application Ser. No. 08/266,999 filed Jun. 27, 1994, abandoned.

BACKGROUND OF THE INVENTION

1. Field of Invention

The present invention relates to a movable stage apparatus capable of precise movement, and particularly relates to a stage apparatus movable in one linear direction capable of high accuracy positioning and high speed movement, which can be especially favorably utilized in a microlithographic system. This invention also relates to an exposure apparatus that is used for the transfer of a mask pattern onto a photosensitive substrate during a lithographic process to manufacture, for example, a semiconductor element, a liquid crystal display element, a thin film magnetic head, or the like.

2. Description of Related Art

When a semiconductor element or the like is manufactured, a projection exposure apparatus is used that transfers an image of a pattern of a reticle, used as a mask, onto each shooting area on a wafer (or a glass plate or the like) on which a resist is coated, used as a substrate, through a projection optical system. Conventionally, as a projection exposure apparatus, a step-and-repeat type (batch exposure type) projection exposure apparatus (stepper) has been widely used. However, a scanning exposure type projection exposure apparatus (a scanning type exposure apparatus), such as a step-and-scan type, which performs an exposure as a reticle and a wafer are synchronously scanned with respect to a projection optical system, has attracted attention.

In a conventional exposure apparatus, a reticle stage, which supports and carries the reticle, which is the original pattern, and the wafer to which the pattern is to be transferred, and the driving part of the wafer stage are fixed to a structural body that supports a projection optical system. The vicinity of the center of gravity of the projection optical system is also fixed to the structural body. Additionally, in order to position a wafer stage with high accuracy, the position of the wafer stage is measured by a laser interferometer, and a moving mirror for the laser interferometer is fixed to the wafer stage.

Furthermore, in order to carry a wafer to a wafer holder on the wafer stage, a wafer carrier arm that takes out a wafer from a wafer cassette and carries it to the wafer holder, and a wafer carrier arm that carries the wafer from the wafer holder to the wafer cassette, are independently provided. When the wafer is carried in, the wafer that has been carried by the wafer carrier arm is temporarily fixed to and supported by a special support member that can be freely raised and lowered and that is provided on the wafer holder. Thereafter, the carrier arm is withdrawn, the support member is lowered, and the wafer is disposed on the wafer holder. After this, the wafer is vacuum absorbed to the top of the wafer holder. When the wafer is carried out from the exposure device, the opposite operation is performed.

As described above, in the conventional exposure apparatus, the driving part of the wafer stage or the like and the projection optical system are fixed to the same structural body. Thus, the vibration generated by the driving reaction of the stage is transmitted to the structural body, and the vibration is also transmitted to the projection optical system. Furthermore, all the mechanical structures were mechanically resonate to a vibration of a predetermined frequency, so there are disadvantages such that deformation of the structural body and the resonance phenomenon occurred, and position shifting of a transfer pattern image and deterioration of contrast occurred when this type of vibration is transmitted to the structural body.

Furthermore, because the wafer stage moves over a long distance from the carrier arm for carrying in and out of the wafer to the exposure position, it is necessary to provide an extremely long moving mirror for the laser interferometer. Because of this, the weight of the wafer stage becomes relatively heavy and the driving reaction becomes large because a heavy motor with a large driving force is needed. Furthermore, in order to improve throughput, when the moving speed and acceleration of the stage needs to be increased, the driving reaction becomes even larger. In addition, as the weight and acceleration of the stage increase, the heating amount of the motor increases, and there is a disadvantage such that measurement stability or the like of the laser interferometer deteriorates.

Furthermore, in the case of carrying the wafer into and out of the exposure apparatus, the wafer is temporarily fixed and supported on the top of a special support member, so carrying in and out of the wafer consumes time. This causes deterioration of throughput. Additionally, as one example, because giving and receiving of the wafer is performed between the carrier arms, the probability of the wafer being contaminated is high, and the probability of having an operation error when the wafer was given and received is high. Furthermore, the number of carrier arms is a major point governing the size of the carrier unit, so the carrier path becomes long when giving and receiving of the wafer is performed between the carrier arms on the carrier path. Additionally, a floor area (foot print) that is needed for the exposure apparatus also becomes large.

In wafer steppers, the alignment of an exposure field to the reticle being imaged affects the success of the circuit of that field. In a scanning exposure system, the reticle and wafer are moved simultaneously and scanned across one another during the exposure sequence.

To attain high accuracy, the stage should be isolated from mechanical disturbances. This is achieved by employing electromagnetic forces to position and move the stage. It should also have high control bandwidth, which requires that the stage be a light structure with no moving parts. Furthermore, the stage should be free from excessive heat generation which might cause interferometer interference or mechanical changes that compromise alignment accuracy.

Commutatorless electromagnetic alignment apparatus such as the ones disclosed in U.S. Pat. Nos. 4,506,204, 4,506,205 and 4,507,597 are not feasible because they require the manufacture of large magnet and coil assemblies that are not commercially available. The weight of the stage and the heat generated also render these designs inappropriate for high accuracy applications.

An improvement over these commutatorless apparatus was disclosed in U.S. Pat. No. 4,592,858, which employs a conventional XY mechanically guided sub-stage to provide the large displacement motion in a plane, thereby eliminating the need for large magnet and coil assemblies. The electromagnetic means mounted on the sub-stage isolates the stage from mechanical disturbances. Nevertheless, the combined weight of the sub-stage and stage still results in low control bandwidth, and the heat generated by the electromagnetic elements supporting the stage is still substantial.

Even though the current apparatus using commutated electromagnetic means is a significant improvement over prior commutatorless apparatus, the problems of low control bandwidth and interferometer interference persist. In such an apparatus, a sub-stage is moved magnetically in one linear direction and the commutated electromagnetic means mounted on the sub-stage in turn moves the stage in the normal direction. The sub-stage is heavy because it carries the magnet tracks to move the stage. Moreover, heat dissipation on the stage compromises interferometer accuracy.

It is also well known to move a movable member (stage) in one long linear direction (e.g. more than 10 cm) by using two of the linear motors in parallel where coil and magnet are combined. In this case, the stage is guided by some sort of a. linear guiding member and driven in one linear direction by a linear motor installed parallel to the guiding member. When driving the stage only to the extent of extremely small stroke, the guideless structure based on the combination of several electromagnetic actuators, as disclosed in the prior art mentioned before, can be adopted. However, in order to move the guideless stage by a long distance in one linear direction, a specially structured electromagnetic actuator as in the prior art becomes necessary, causing the size of the apparatus to become larger, and as a result, generating a problem of consuming more electricity.

SUMMARY OF THE INVENTION

It is an object of the present invention to make it possible for a guideless stage to move with a long linear motion using electromagnetic force, and to provide a light weight apparatus in which low inertia and high response are achieved.

It is another object of the present invention to provide a guideless stage apparatus using commercially available regular linear motors as electromagnetic actuators for one linear direction motion.

It is another object of the present invention to provide a guideless stage apparatus capable of active and precise position control for small displacements without any contact in the direction orthogonal to the long linear motion direction.

It is another object of the present invention to provide a completely non-contact stage apparatus by providing a movable member (stage body) that moves in one linear direction and a second movable member that moves sequentially in the same direction, constantly keeping a certain space therebetween, and providing the electromagnetic force (action and reaction forces) in the direction orthogonal to the linear direction between this second movable member and the stage body.

It is another object of the present invention to provide a non-contact stage apparatus capable of preventing the positioning and running accuracy from deteriorating by changing tension of various cables and tubes to be connected to the non-contact stage body that moves as it supports an object.

It is another object of the present invention to provide a non-contact apparatus that is short in its height, by arranging the first movable member and the second movable member in parallel, which move in the opposite linear direction to one another.

It is another object of the present invention to provide an apparatus that is structured so as not to change the location of the center of gravity of the entire apparatus even when the non-contact stage body moves in one linear direction.

Another object of this invention is to provide an exposure apparatus that can perform an exposure with high accuracy by reducing the effects of vibration on a projection optical system or the like that occurs when the wafer stage or the like is driven.

Another object of this invention is to provide an exposure apparatus that suppresses the amount of heat generated by the driving part of the wafer stage, to perform positioning of the driving part of the wafer stage with high accuracy, and to maintain the measurement stability of a position measurement device or the like.

Another object of this invention is to provide an exposure apparatus with high throughput that can carry a wafer to an exposure apparatus without temporarily fixing the wafer, and without giving and receiving of the wafer between wafer carrier arms.

In order to achieve the above and other objects, embodiments of the present invention may be constructed as follows.

An apparatus that is capable of high accuracy position and motion control utilizes linear commutated motors to move a guideless stage in one long linear direction and to create small yaw rotation in a plane. A carrier/follower holding a single voice coil motor (VCM) is controlled to approximately follow the stage in the direction of the long linear motion. The VCM provides an electromagnetic force to move the stage for small displacements in the plane in a linear direction perpendicular to the direction of the long linear motion to ensure proper alignment. This follower design eliminates the problem of cable drag for the stage since the cables connected to the stage follow the stage via the carrier/follower. Cables connecting the carrier/follower to external devices will have a certain amount of drag, but the stage is free from such disturbances because the VCM on the carrier/follower acts as a buffer by preventing the transmission of mechanical disturbances to the stage.

According to one aspect of the invention, the linear commutated motors are located on opposite sides of the stage and are mounted on a driving frame. Each linear commutated motor includes a coil member and a magnetic member, one of which is mounted on one of the opposed sides of the stage, and the other of which is mounted on the driving frame. Both motors drive in the same direction. By driving the motors slightly different amounts, small yaw rotation of the stage is produced.

In accordance with another aspect of the present invention, a moving counter-weight is provided to preserve the location of the center of gravity of the stage system during any stage motion by using the conservation of momentum principle. In an embodiment of the present invention, the drive frame carrying one member of each of the linear motors is suspended above the base structure, and when the drive assembly applies an action force to the stage to move the stage in one direction over the base structure, the driving frame moves in the opposite direction in response to the reaction force to substantially maintain the center of gravity of the apparatus. This apparatus essentially eliminates any reaction forces between the stage system and the base structure on which the stage system is mounted, thereby facilitating high acceleration while minimizing vibrational effects on the system.

By restricting the stage motion to the three specified degrees of freedom, the apparatus is simple. By using electromagnetic components that are commercially available, the apparatus design is easily adaptable to changes in the size of the stage. This high accuracy positioning apparatus is ideally suited for use as a reticle scanner in a scanning exposure system by providing smooth and precise scanning motion in one linear direction and ensuring accurate alignment by controlling small displacement motion perpendicular to the scanning direction and small yaw rotation in the scanning plane.

An exposure apparatus according to another aspect of this invention includes a projection optical system support member that supports a projection optical system, so that the projection optical system rotates within a specified area, taking a reference point as a center. Therefore, even if vibration from a substrate stage and a mask stage is transmitted to the projection optical system, the position relationship between the object plane (mask) and the image plane (substrate) is not shifted. Thus, it is possible to prevent position shifting of the pattern to be transferred, and highly accurate exposure can be performed.

Furthermore, a mask stage that moves a mask, a structural body that supports this mask stage and the projection optical system, and a substrate stage that moves a substrate are provided. The projection optical system support part (the structural body) has at least three flexible support members extending from the structural body, and the extending lines of each support member cross at the reference point. In this case, even if vibration is transmitted to the projection optical system, the projection optical system is minutely rotated taking the reference point as a center. Therefore, it is possible to prevent position shifting of the pattern to be transferred to the substrate. Furthermore, the support members are flexible, so the minute vibration can be reduced and the deterioration of contrast of a pattern to be formed can be prevented.

An exposure apparatus according to another aspect of this invention controls the mask base so that the mask base moves at a specified speed in a direction opposite to the moving direction of the mask stage. This reduces the effects to the structural body of the driving reaction of the mask stage. Additionally, the excitation of mechanical resonance is controlled, and the vibration transmitted to the structural body and the projection optical system can be reduced. Therefore, exposure with a high accuracy can be performed.

In an exposure apparatus according to another aspect of this invention, by having an elastic member at both ends of a guide axis, when the substrate table performs constant velocity reciprocation on the guide axis, the kinetic energy of the substrate table is converted to potential energy and is stored in the elastic members. Therefore, the energy to be consumed when the substrate table is reciprocated at constant velocity is mainly only the energy to be consumed in the viscosity resistance of the substrate table with respect to air. The only heat generated is the heat from when the elastic members are deformed. Therefore, it is possible to control the heating amount of the driving part when the substrate table moves at constant velocity.

Furthermore, when the elastic member has first magnetic members disposed at both ends of the guide axis and second magnetic members disposed corresponding to the first magnetic members, by the attraction of the first and second magnetic members, when the substrate table is still-positioned at an end of the guide axis, it is possible to reduce the thrust of the driving part of the substrate table required to oppose the resistance of the elastic member. Thus, the heating amount of the driving part can be controlled when the substrate table is still-positioned.

In an exposure apparatus according to another aspect of this invention, by controlling the length of the support legs that can be freely extended and retracted in the support direction, the tilt angle of the substrate table and its position in the height direction can be controlled, and highly accurate exposure can be performed as the surface of the substrate is aligned within the image plane.

Furthermore, when the mask and the substrate are synchronously and moved during exposure, the tilt angle of the scanning surface of the substrate stage of the structural body in the scanning direction, the tilt angle in the non-scanning direction, and the height are detected. When the support legs that can be freely extended and retracted are controlled based upon the detection result, highly accurate scanning exposure can be performed as the surface of the substrate is aligned within the image plane.

Furthermore, when the rotation angle of the substrate stage about the optical axis of the projection optical system and the position shifting amount are detected, and the position of the mask stage or the substrate stage is controlled based upon this detection result, the positioning between the surface of the substrate and the image plane can be performed with high accuracy.

In an exposure apparatus according to another aspect of this invention, a visco-elastic body exists between the support member and the structural body, so it is possible to reduce the vibration from the floor on which the exposure device is disposed. Therefore, exposure can be performed with high accuracy.

In an exposure apparatus according to another aspect of this invention, at least one groove is provided in the substrate table, and a substrate can be disposed on the substrate table without the substrate carrier arms contacting the substrate table. That is, there is an advantage such that the substrate can be carried into and out from the exposure device, without temporarily fixing and supporting the substrate on the substrate table, and throughput can be improved.

Furthermore, when the substrate carrier mechanism has at least two substrate carrier arms and substrate storage case support members, the substrate carrier arms can be freely moved in the three directions such as a rotational direction about the optical axis of the projection optical system, the horizontal direction, and the vertical direction, and the substrate storage case support member can be freely moved in the vertical direction, there are advantages such that the substrate stage can be moved below the substrate carrying-out arms or the substrate carrying-in arms, the substrate can be carried to the exposure device without transferring the substrate between the substrate carrier arms, and the probability of problems occurring during the carrying and the probability of foreign objects attaching to the wafer can be reduced.

Other aspects and features and advantages of the present invention will become more apparent upon a review of the following specification taken in conjunction with the accompanying drawings wherein similar characters of reference indicate similar elements in each of the several views.

BRIEF DESCRIPTION OF THE DRAWINGS

FIG. 13A is a plan view showing the wafer stage of FIG. 11. FIG. 13B is a cross-sectional view of FIG. 13A along line B—B. FIG. 13C is a front view omitting part of FIG. 13A. FIG. 13D is a cross-sectional view of FIG. 13A along line D—D.

DETAILED DESCRIPTION OF PREFERRED EMBODIMENTS

While the present invention has applicability generally to electromagnetic alignment system, the preferred embodiments involve a scanning apparatus for a reticle stage as illustrated in FIGS. 1–6.

Figure 6:
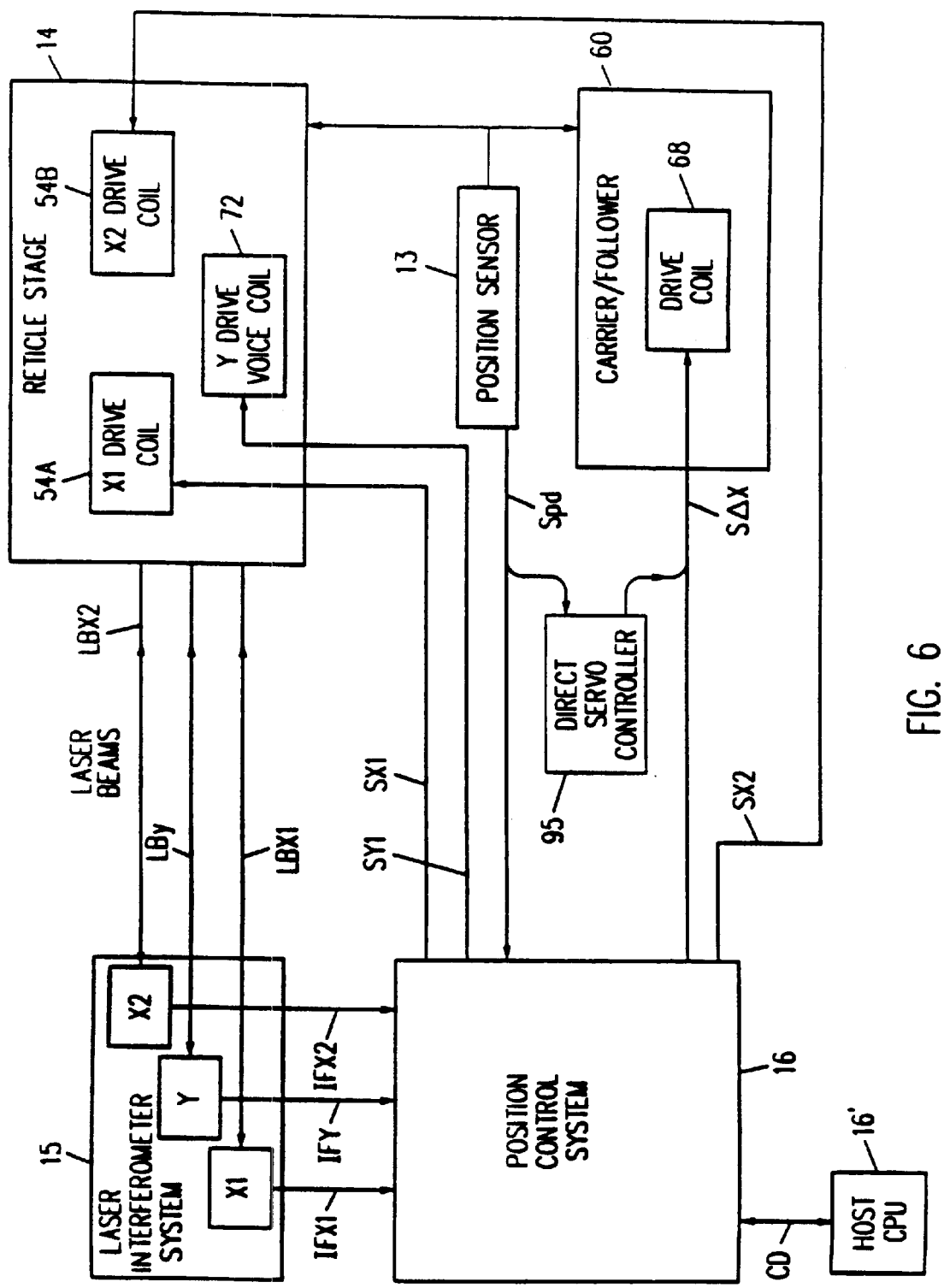
FIG. 6 is a block diagram schematically illustrating the sensing and control systems for controlling the position of the stage.

Referring now to the drawings, the positioning apparatus 10 of the present invention includes a base structure 12 above which a reticle stage 14 is suspended and moved as desired, a reticle stage position tracking laser interferometer system 15, a position sensor 13 and a position control system 16 operating from a CPU 16' (see FIG. 6).

An elongate positioning guide 17 is mounted on the base 12, and support brackets 18 (two brackets in the illustrated embodiment) are movably supported on the guide 17 such as by air bearings 20. The support brackets 18 are connected to a driving assembly 22 in the form of a magnetic track assembly or driving frame for driving the reticle stage 14 in the X direction and small yaw rotation. The driving frame includes a pair of parallel spaced apart magnetic track arms 24 and 26 which are connected together to form an open rectangle by cross arms 28 and 30. In the preferred embodiment, the driving frame 22 is movably supported on the base structure 12 such as by air bearings 32 so that the frame is free to move on the base structure in a direction aligned with the longitudinal axis of the guide 17, the principal direction in which the scanning motion of the reticle stage is desired. As used herein "one direction" or a "first direction" applies to movement of the frame 22 or the reticle stage 14 either forward or backward in the X direction along a line aligned with the longitudinal axis of the guide 17.

Figure 1:
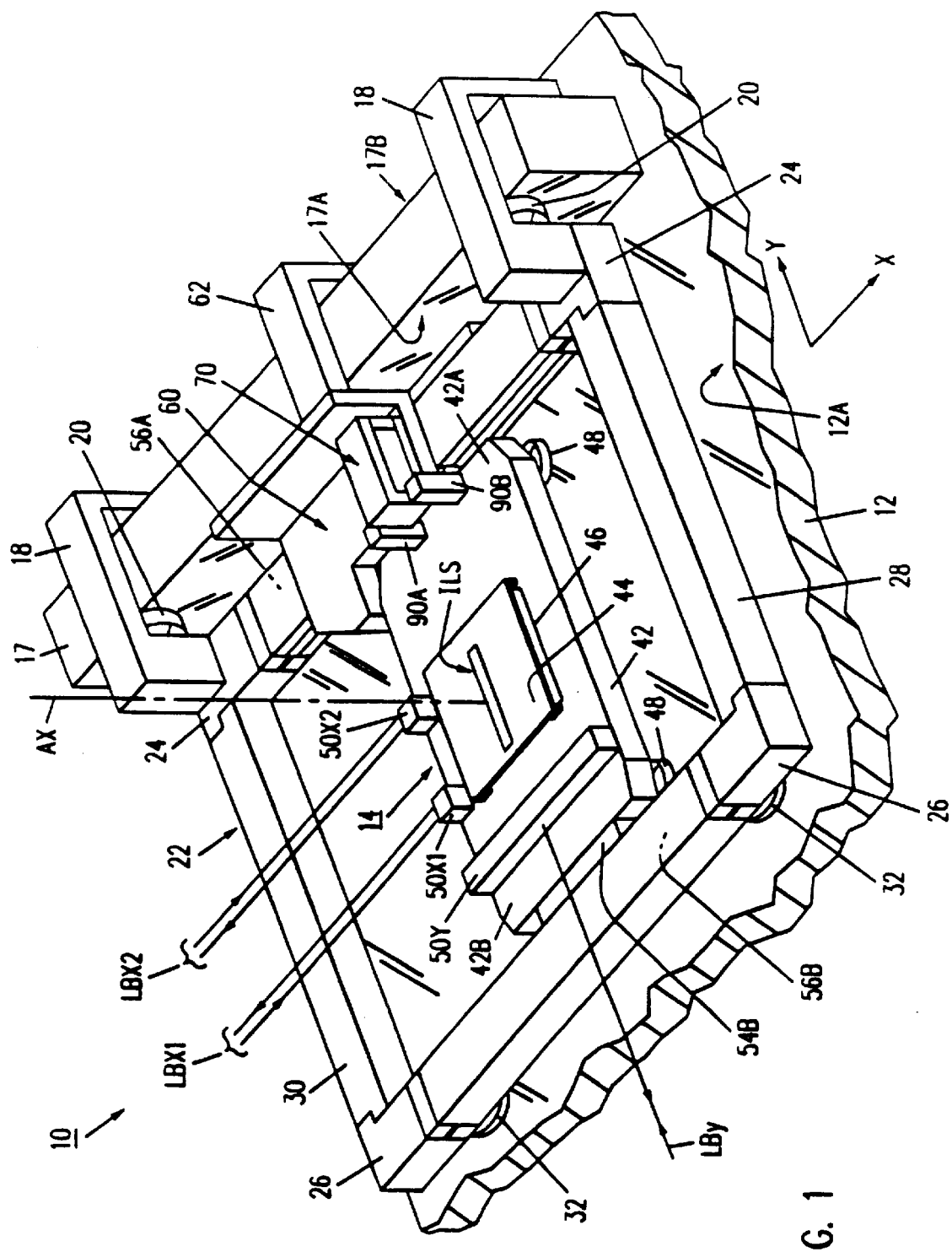
FIG. 1 is a schematic perspective view of an apparatus in accordance with an embodiment of the present invention.
Figure 3:
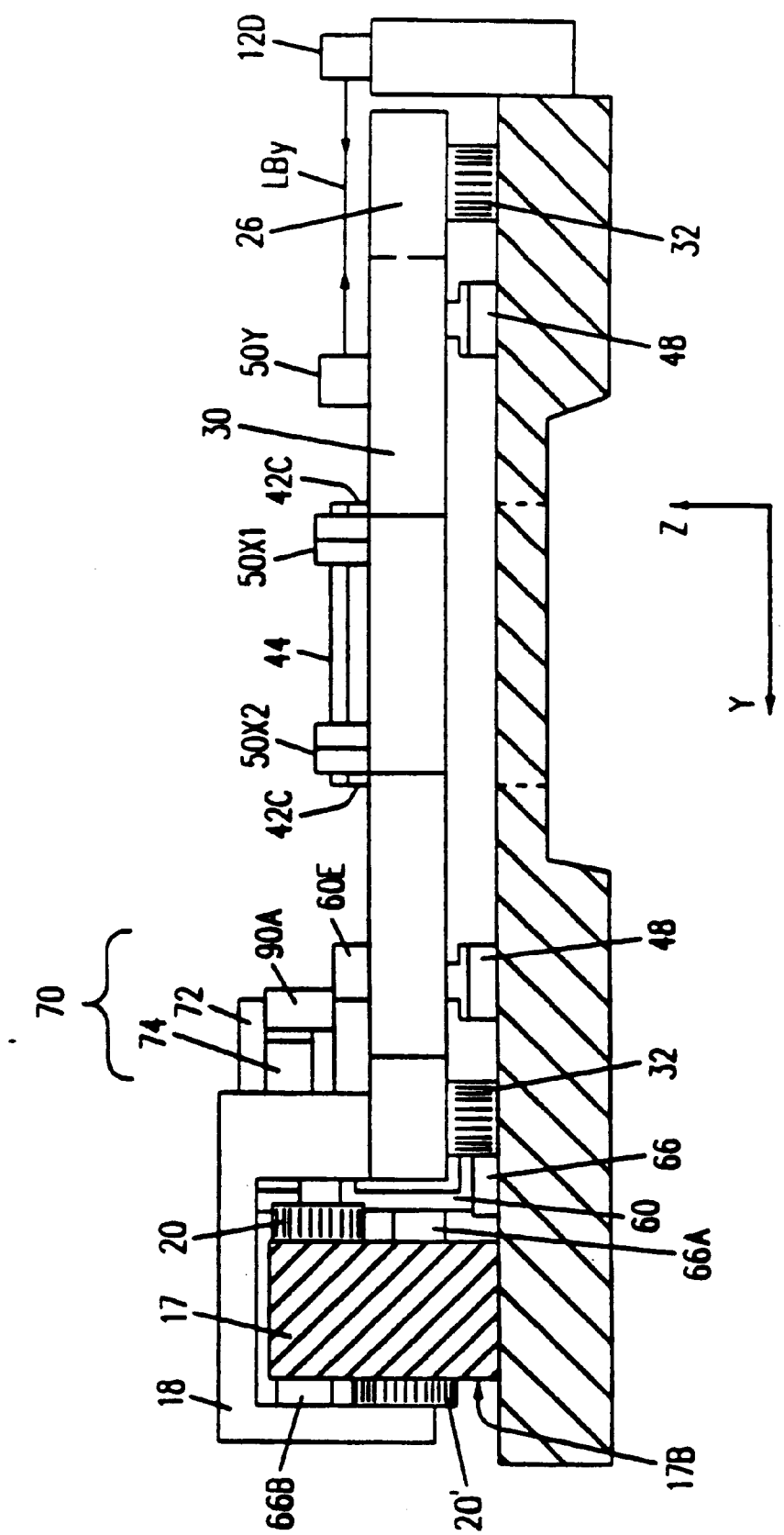
FIG. 3 is an end elevational view of the structure shown in FIG. 2 taken along line 3–3' in the direction of the arrows.

Referring now to FIGS. 1 and 3 to explain further in detail, the elongate guiding member 17 in the X direction has front and rear guiding surfaces 17A and 17B, which are almost perpendicular to the surface 12A of the base structure 12. The front guiding surface 17A is against the rectangular driving frame 22 and guides the air bearing 20 which is fixed to the inner side of the support bracket 18. A support bracket 18 is mounted on each end of the upper surface of the arm 24, which is parallel to the guiding member 17 of the driving frame 22. Furthermore, each support bracket 18 is formed in a hook shape so as to straddle the guiding member 17 in the Y direction, and with the free end against the rear guiding surface 17B of the rear side of the guiding member 17. The air bearing 20' is fixed inside the free end of the support brackets 18 and against the rear guiding surface 17B. Therefore, each of the support brackets 18 is constrained in its displacement in the Y direction by the guiding member 17 and air bearings 20 and 20' and is able to move only in the X direction.

Now according to the first embodiment of the present invention, the air bearings 32, which are fixed to the bottom surfaces of the four rectangular parts of the driving frame 22, make an air layer leaving a constant (several $\mu$m) between the pad surface and the surface 12A of the base structure 12. The driving frame is buoyed up from the surface 12A and supported perpendicularly (in the Z direction) by the air layer. It will be explained in detail later, but in FIG. 1, the carrier/follower 60 shown positioned above the upper part of the elongate arm 24 is positioned laterally in the Y direction by air bearings 66A and 66B supported by a bracket 62 against opposite surfaces 17A and 17B of guiding member 17 and vertically in the Z direction by air bearings 66 above the surface 12A of the base structure 12. Thus, the carrier/follower 60 is positioned so as not to contact any part of the driving frame 22. Accordingly, the driving frame 22 moves only in one linear X direction, guided above the base surface 12A and laterally by the guiding member 17.

Referring now to both FIG. 1 and FIG. 2, the structure of the reticle stage 14 and the driving frame 22 will be explained. The reticle stage 14 includes a main body 42 on which the reticle 44 is positioned above an opening 46. The reticle body 42 includes a pair of opposed sides 42A and 42b and is positioned or suspended above the base structure 12 such as by air bearings 48. A plurality of interferometer mirrors 50 are provided on the main body 42 of the reticle stage 14 for operation with the laser interferometer position sensing system 15 (see FIG. 6) for determining the exact position of the reticle stage which is fed to the position control system 16 in order to direct the appropriate drive signals for moving the reticle stage 14 as desired.

Primary movement of the reticle stage 14 is accomplished with first electromagnetic drive assembly or means in the form of separate drive assemblies 52A and 52B (FIG. 2) on each of the opposed sides 42A and 42B, respectively. The drive assemblies 52A and 52B include drive coils 54A and 54B fixedly mounted on the reticle stage 14 at the sides 42A and 42B, respectively, for cooperating with magnet tracks 56A and 56B on the magnet track arms 24 and 26, respectively, of the drive frame 22. While in the preferred embodiment of the invention the magnet coils are mounted on the reticle stage and the magnets are mounted on the drive frame 22, the positions of these elements of the electromagnetic drive assembly 52 could be reversed.

Here, the structure of the reticle stage 14 will be explained further in detail. As shown in FIG. 1, the stage body 42 is installed so that it is free to move in the Y direction in the rectangular space inside the driving frame 22. The air bearing 48 fixed under each of the four corners of the stage body 42 makes an extremely small air gap between the pad surface and the base surface 12A, and buoys up and supports the entire stage 14 from the surface 12A. These air bearings 48 should preferably be pre-loaded types with a recess for vacuum attraction to the surface 12A.

Figure 2:
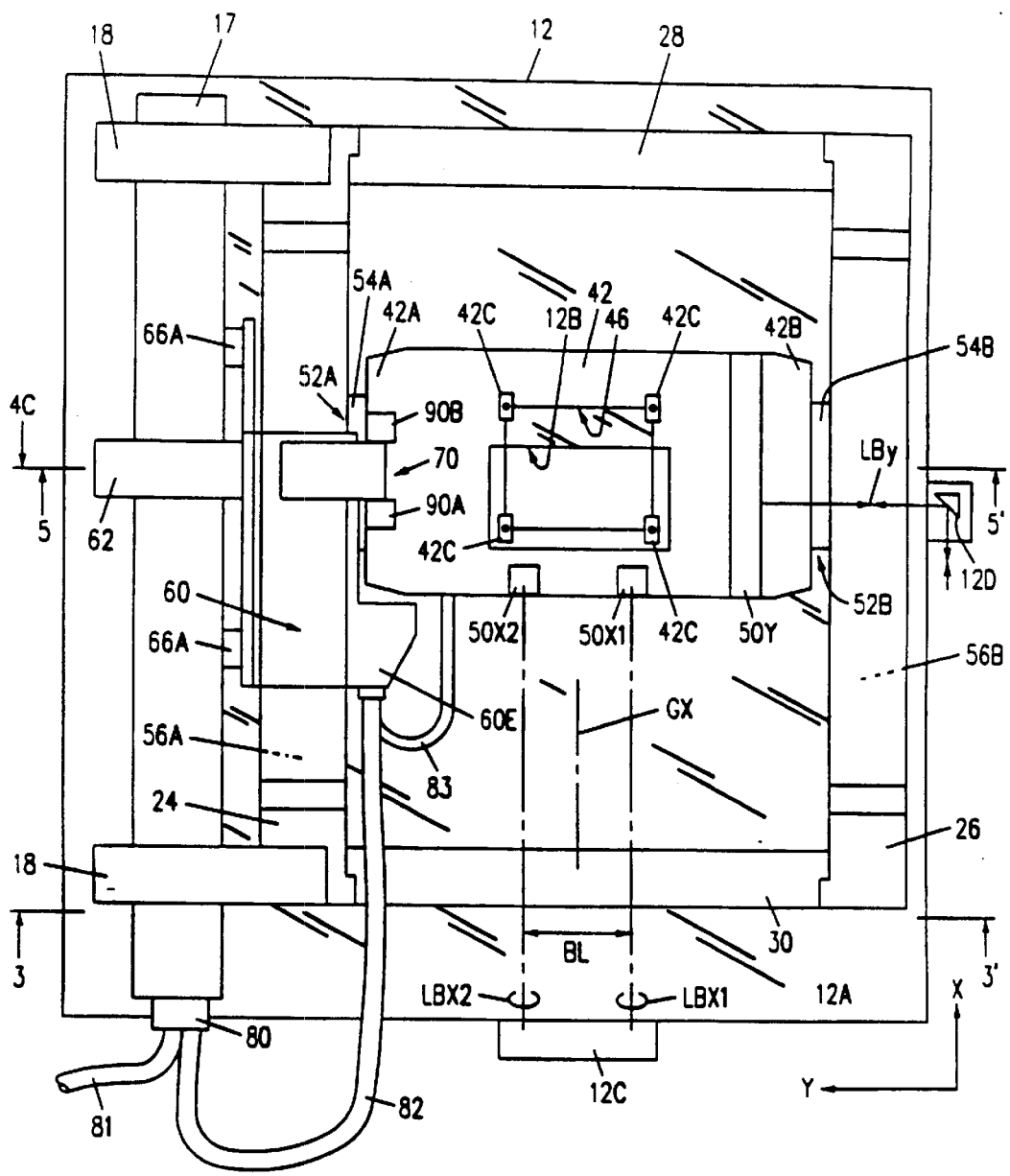
FIG. 2 is a top plan view of the apparatus shown in FIG. 1.

As shown in FIG. 2, a rectangular opening 46 in the center of the stage body 42 is provided so that the projected image of the pattern formed on the reticle 44 can pass therethrough. In order for the projected image via the rectangular opening 46 to pass through the projection optical system PL (see FIG. 5) which is installed below the rectangular opening, there is another opening 12B provided at the center part of the base structure 12. The reticle 44 is loaded on the top surface of the stage body by clamping members 42C, which are protrusively placed at four points around the rectangular opening 46, and clamped by vacuum pressure.

The interferometer mirror 50Y, which is fixed near the side 42B of the stage body 42 near the arm 26, has a vertical elongate reflecting surface in the X direction which length is somewhat longer than the movable stroke of the stage 14 in the X direction, and the laser beam LBY from the Y-axis interferometer is incident perpendicularly on the reflecting surface. In FIG. 2, the laser beam LBY is bent at a right angle by the mirror 12D, which is fixed on the side of the base structure 12.

Referring now to FIG. 3 as a partial cross-sectional drawing of the view along line 3–3' in FIG. 2, the laser beam LBY which is incident on the reflecting surface of the interferometer mirror 50Y is placed so as to be on the same plane as the bottom surface (the surface where the pattern is formed) of the reticle 44 which is mounted on the clamping member 42C. Furthermore, in FIG. 3, the air bearing 20 on the end side of the support brackets 18 against the guiding surface 17B of the guiding member 17 is also shown.

Referring once again to FIGS. 1 and 2, the laser beam LBX1 from the X1-axis interferometer is incident and reflected on the interferometer mirror 50X1, and the laser beam LBX2 from the X2-axis interferometer is incident and reflected on the interferometer mirror 50X2. These two mirrors 50X1 and 50X2 are structured as corner tube type mirrors, and even when the stage 14 is in yaw rotation, they always maintain the incident axis and reflecting axis of the laser beams parallel within the XY plane. Further more, the block 12C in FIG. 2 is an optical block, such as a prism, to orient the laser beams LBX1 and LBX2 to each of the mirrors 50X1 and 50X2, and is fixed to a part of the base structure 12. The corresponding block for the laser beam LBY is not shown.

In FIG. 2, the distance BL in the Y direction between each of the center lines of the two laser beams LBX1 and LBX2 is the length of the base line used to calculate the amount of yaw rotation. Accordingly, the value of the difference between the measured value $\Delta X1$ in the X direction of the X1-axis interferometer and the measured value $\Delta X2$ in the X direction of the X2-axis interferometer divided by the base line length BL is the approximate amount of yaw rotation in an extremely small range. Also, half the value of the sum of $\Delta X1$ and $\Delta X2$ represents the X coordinate position of the entire stage 14. These calculations are performed by a high speed digital processor in the position control system 16 shown in FIG. 6.

Furthermore, the center lines of each of the laser beams LBX1 and LBX2 are set on the same surface where the pattern is formed on the reticle 44. The extension of the line GX, which is shown in FIG. 2 and divides in half the space between each of the center lines of laser beams LBX1 and LBX2, and the extension of the laser beam LBY intersect within the same surface where the pattern is formed. Additionally, the optical axis AX (see FIGS. 1 and 5) also crosses at this intersection as shown in FIG. 1. In FIG. 1, a slit shaped illumination field ILS which includes the optical axis AX is shown over the reticle 44, and the pattern image of the reticle 44 is scanned and exposed onto the photosensitive substrate via the projection optical system PL.

Furthermore, there are two rectangular blocks 90A and 90B fixed on the side 42A of the stage body 42 in FIGS. 1 and 2. These blocks 90A and 90B are to receive the driving force in the Y direction from the second electromagnetic actuator 70 which is mounted on the carrier/follower 60. Details will be explained below.

The driving coils 54A and 54B which are fixed on the both sides of the stage body 42 are formed flat parallel to the XY plane, and pass through the magnetic flux space in the slot which extends in the X direction of the magnetic tracks 56A and 56B without any contact. The assembly of the driving coil 54 and the magnetic track 56 used in the present embodiment is a commercially easily accessible linear motor for general purposes, and it could be either with or without a commutator.

Here, considering the actual design, the moving stroke of the reticle stage 14 is mostly determined by the size of the reticle 44 (the amount of movement required at the time of scanning for exposure and the amount of movement required at the time of removal of the reticle from the illumination optical system to change the reticle). In the case of the present embodiment, when a 6-inch reticle is used, the moving stroke is about 30 cm.

As mentioned before, the driving frame 22 and the stage 14 are independently buoyed up and supported on the base surface 12A, and at the same time, magnetic action and reaction forces are applied to one another in the X direction only by the linear motor 52. Because of that, the law of the conservation of momentum is seen between the driving frame 22 and the stage 14.

Now, suppose the weight of the entire reticle stage 14 is about one fifth of the entire weight of the frame 22 which includes the support brackets 18. Then, the forward movement of 30 cm of the stage 14 in the X direction makes the driving frame 22 move by 6 cm backwards in the X direction. This means that the location of the center of gravity of the apparatus on the base structure 12 is essentially fixed in the X direction. In the Y direction, there is no movement of any heavy object. Therefore, the change in the location of the center of gravity in the Y direction is also relatively fixed.

The stage 14 can be moved in the X direction as described above, but the moving coils (54A, 54B) and the stators (56A, 56B) of the linear motors 52 will interfere with each other (collide) in the Y direction without an X direction actuator. Therefore, the carrier/follower 60 and the second electromagnetic actuator 70 are provided to control the stage 14 in the Y direction. Their structures will be explained with reference to FIGS. 1, 2, 3 and 5.

As shown in FIG. 1, the carrier/follower 60 is movably installed in the Y direction via the hook-like support bracket 62 which straddles over the guiding member 17. Furthermore as evident from FIG. 2, the carrier/follower 60 is placed above the arm 24, so as to maintain a certain space between the stage 14 (the body 42) and the arm 24, respectively. One end 60E of the carrier/follower 60, is substantially protruding inward (toward the stage body 42) over the arm 24. Inside this end part 60E is fixed a driving coil 68 (FIGS. 4A and 6) (having the same shape as the coil 54) which enters a slot space of the magnetic track 56A.

Furthermore, the bracket 62 supported by air bearing 66A (see FIGS. 2, 3, 4A and 5) against the guiding surface 17A of the guiding member 17 is fixed in the space between the guiding member 17 of the carrier/follower 60 and the arm 24. The air bearing 66 that buoys up and supports the carrier/follower 60 on the base surface 12A is also shown in FIG. 3.

The air bearing 66B against the guiding surface 17B of the guiding member 17 is also fixed to the free end of support bracket 62 on the other side of the hook from air bearing 66A with guiding member 17 therebetween.

Figure 5:
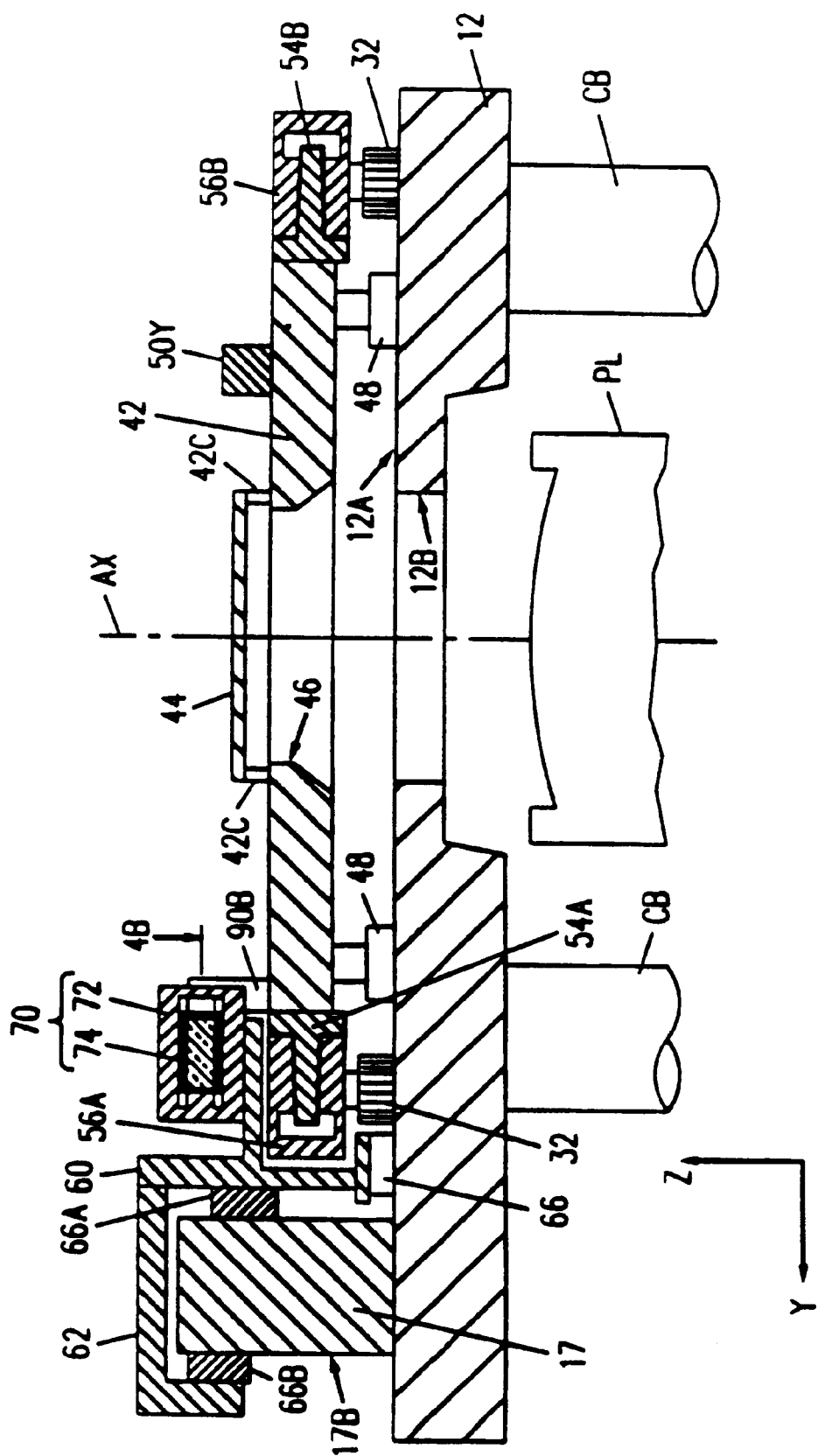
FIG. 5 is an elevational sectional view of a portion of the structure shown in FIG. 2 taken along line 5–5' in the direction of the arrows.

Now, as evident from FIG. 5, the carrier/follower 60 is arranged so as to keep certain spaces with respect to both the magnetic track 56A and the stage body 42 in the Y and Z directions, respectively. Shown in FIG. 5 are the projection optical system PL and column rod CB to support the base structure 12 above the projection optical system PL. Such an arrangement is typical for a projection aligner, and unnecessary shift of the center of gravity of the structures above the base structure 12 would cause a lateral shift (mechanical distortion) between the column rod CB and the projection optical system PL, and thus result in a deflection of the image on the photosensitive substrate at the time of exposure. Hence, the merit of the device as in the present embodiment where the motion of the stage 14 does not shift the center of gravity above the base structure 12 is substantial.

Figure 4A:
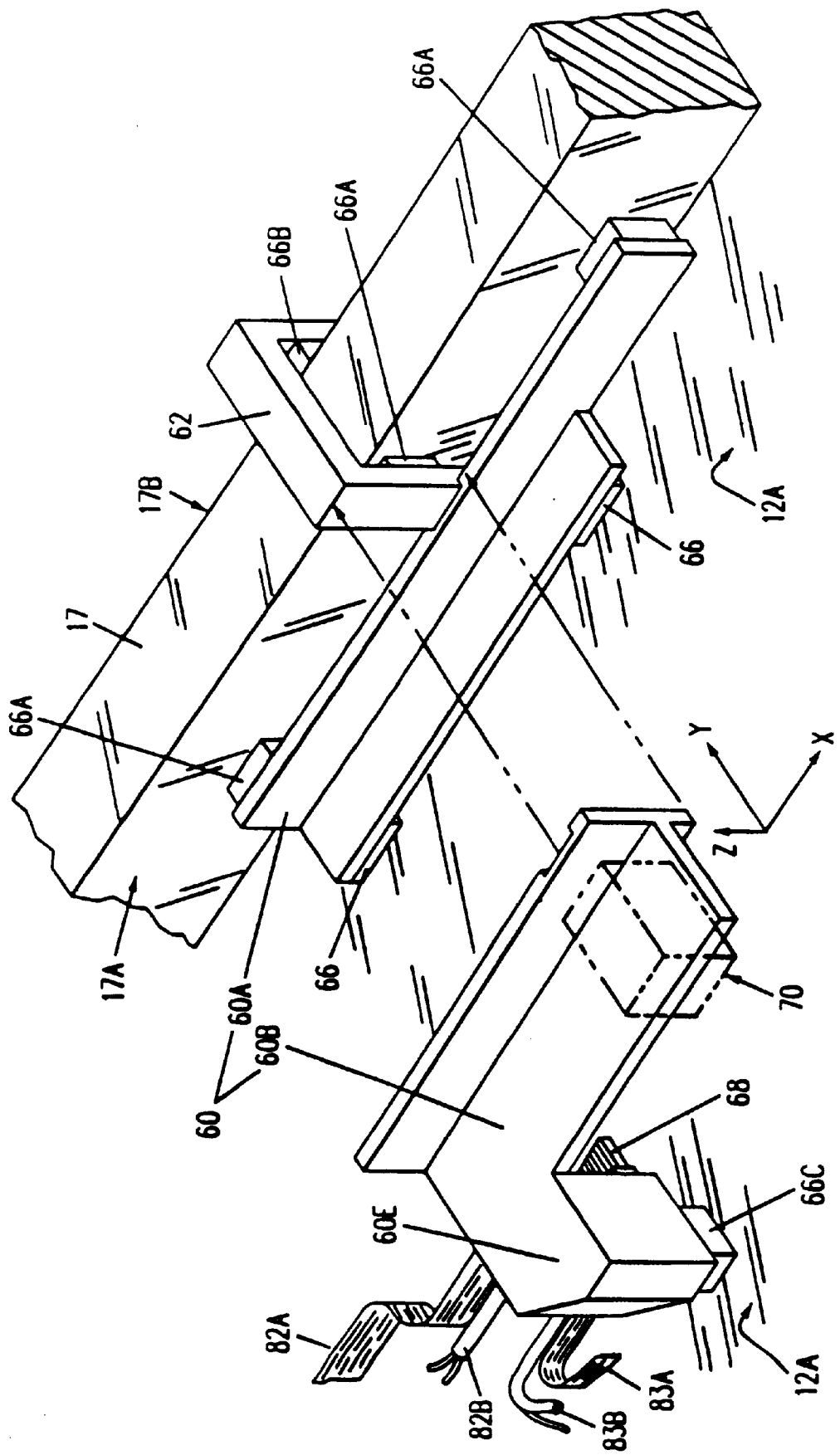
FIG. 4A is an enlarged perspective, partially exploded view showing the carrier/follower structure of FIG. 1 and exploded from the positioning guide.

Furthermore referring now to FIG. 4A, the structure of the carrier/follower 60 will be explained. In FIG. 4A, the carrier/follower 60 is disassembled into two parts, 60A and 60B, for the sake of facilitating one's understanding. As evident from FIG. 4A, the driving coil 68 that moves the carrier/follower 60 itself in the X direction is fixed at the lower part of the end 60E of the carrier/follower 60. Furthermore, the air bearing 66C is placed against the base structure 12A on the bottom surface of the end 60E and helps to buoy up the carrier/follower 60.

Hence the carrier/follower 60 is supported in the Z direction with three points—the two air bearings 66 and one air bearing 66C—and is constrained in the Y direction for movement in the X direction by air bearings 66A and 66B. What is important in this structure is that the second electromagnetic actuator 70 is arranged back to back with the support bracket 62 so that when the actuator generates the driving force in the Y direction, reaction forces in the Y direction between the stage 14 and the carrier/follower 60 actively act upon the air bearings 66A and 66B which are fixed inside the support bracket 62. In other words, arranging the actuator 70 and the air bearings 66A, 66B on the line parallel to the Y-axis in the XY plane helps prevent the generation of unwanted stress, which might deform the carrier/follower 60 mechanically when the actuator 70 is in operation. Conversely, it means that it is possible to reduce the weight of the carrier/follower 60.

Figure 4B:
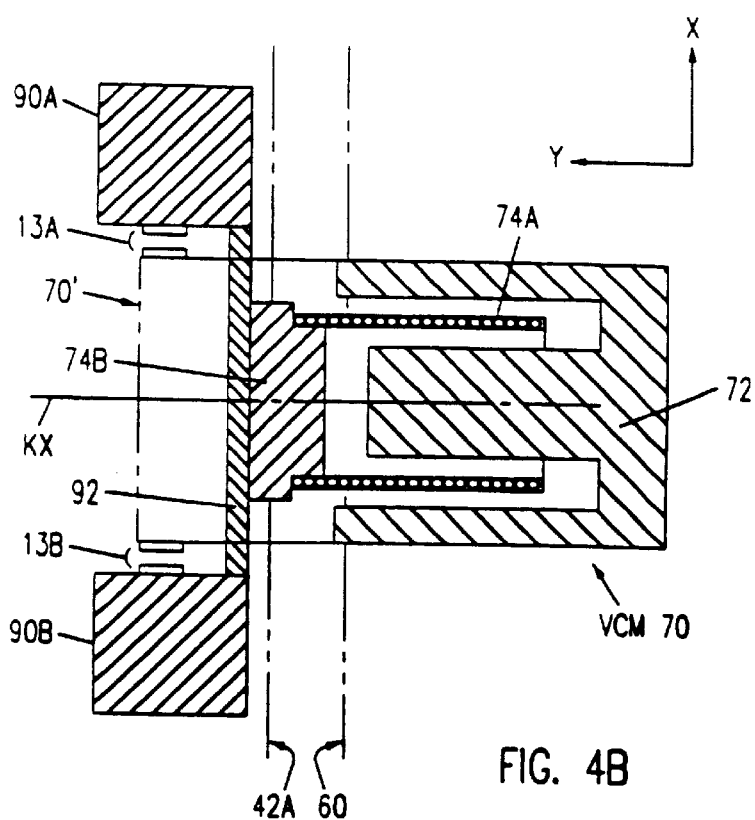
FIG. 4B is an enlarged horizontal sectional view of a portion of the structure shown in FIG. 5 taken along line 4B in the direction of the arrow.
Figure 4C:
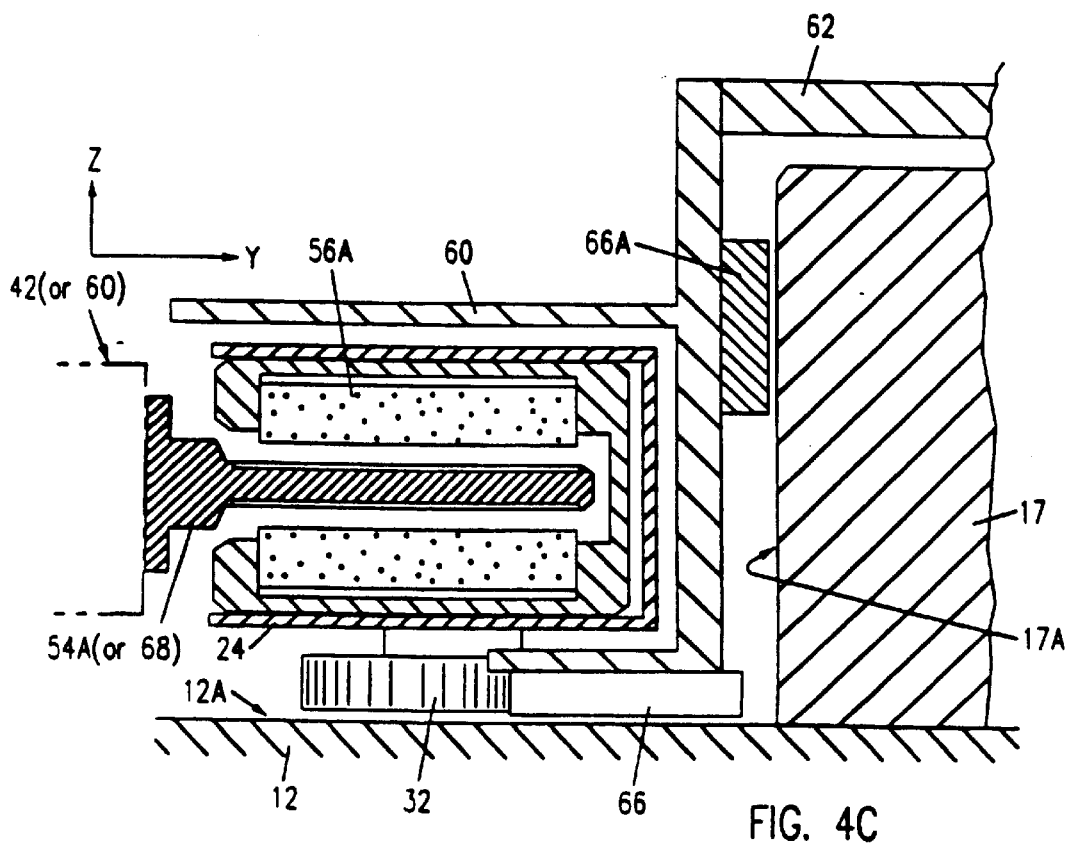
FIG. 4C is an enlarged elevational sectional view of a portion of the structure shown in FIG. 2 taken along line 4C in the direction of the arrow but with the voice coil motor removed.

As evident from FIGS. 2, 4A and 4C described above, the magnetic track 56A in the arm 24 of the driving frame 22 provides magnetic flux for the driving coil 54A on the stage body 42 side, and concurrently provides magnetic flux for the driving coil 68 for the carrier/follower 60. As for the air bearings 66A, 66B and 66C, a vacuum pre-loaded type is preferable, since the carrier/follower 60 is light. Besides the vacuum pre-loaded type, a magnetic pre-loaded type is also acceptable.

Next with reference to FIGS. 3, 4B and 5, the second actuator mounted on the carrier/follower 60 will be explained. A second electromagnetic drive assembly in the form of a voice coil motor 70 is made up of a voice coil 74 attached to the main body 42 of the reticle stage 14 and a magnet 72 attached to the carrier/follower 60 to move the stage 14 for small displacements in the Y direction in the plane of travel of the stage 14 orthogonal to the X direction long linear motion produced by the driving assembly 22. The positions of the coil 74 and magnet 72 could be reversed. A schematic structure of the voice coil motor (VCM) 70 is as shown in FIGS. 3 and 5, and the detailed structure is shown in FIG. 4B. FIG. 4B is a cross-sectional view of the VCM 70 sectioned at the horizontal plane shown with an arrow 4B in FIG. 5. In FIG. 4B, the magnets 72 of the VCM 70 are fixed onto the carrier/follower 60 side. The coil of the VCM 70 comprises the coil body 74A and its supporting part 74B. The supporting part 74B is fixed to a connecting plate 92 (a plate vertical to the XY plane) which is rigidly laid across the two rectangular blocks 90A and 90B. A center line KX of the VCM 70 shows the direction of the driving force of the coil 74, and when an electric current flows through the coil body 74A, the coil 74 displaces into either positive or negative movement in the Y direction in accordance with the direction of the current, and generates a force corresponding to the amount of the current. Normally, in a commonly used VCM, a ring-like damper or bellows are provided between the coil and magnet so as to keep the gap between the coil and magnet, but according to the present embodiment, that gap is kept by a follow-up motion of the carrier/follower 60, and therefore, such supporting elements as a damper or bellows are not necessary.

In the present embodiment, capacitance gap sensors 13A and 13B are provided as a positioning sensor 13 (see FIG. 6) as shown in FIG. 4B. In FIG. 4B, electrodes for capacitance sensors are placed so as to detect the change in the gap in the X direction between the side surface of the rectangular blocks 90A and 90B facing each other in the X direction and the side surface of a case 70' of the VCM 70. Such a positioning sensor 13 can be placed anywhere as far as it can detect the gap change in the Y direction between the carrier/follower 60 and the stage 14 (or the body 42). Furthermore, the type of the sensor can be any of a non-contact type such as, for example, photoelectric, inductive, ultrasonic, or air-micro system.

The case 70' in FIG. 4B is formed with the carrier/follower 60 in one, and placed (spatially) so as not to contact any member on the reticle stage 14 side. As for the gap between the case 70' and the rectangular blocks 90A and 90B in the X direction (scanning direction), when the gap on the sensor 13A side becomes wider, the gap on the sensor 13B side becomes smaller. Therefore, if the difference between the measured gap value by the sensor 13A and the measured gap value by the sensor 13B is obtained by either digital operation or analog operation, and a direct servo (feedback) control system which controls the driving current of the driving coil 68 for the carrier/follower 60 is designed using a servo driving circuit which makes the gap difference zero, then the carrier/follower 60 will automatically perform a follow-up movement in the X direction always keeping a certain space to the stage body 42. Alternatively, it is also possible to design an indirect servo control system which controls an electric current flow to the driving coil 68, with the operation of position control system 16 in FIG. 6 using the measured gap value obtained only from one of the sensors and the X coordinate position of the stage 14 measured from the X axis interferometer, without using the two gap sensors 13A and 13B differentially.

In the VCM 70 as described in FIG. 4B, the gap between the coil body 74A and the magnet 72 in the X direction (non-energizing direction) is in actuality about 2–3 mm. Therefore, a follow-up accuracy of the carrier/follower 60 with respect to the stage body 42 would be acceptable at around ±0.5–1 mm. This accuracy depends on how much of the yaw rotation of the stage body is allowed, and also depends on the length of the line in the KX direction (energizing direction) of the coil body 74A of the VCM 70. Furthermore, the degree of the accuracy for this can be substantially lower than the precise positioning accuracy for the stage body 42 using an interferometer (e.g., ±0.03 $\mu$m supposing the resolution of the interferometer is 0.01 $\mu$m). This means that the servo system for a follower can be designed fairly simply, and the amount of cost to install the follower control system would be small. Furthermore, the line KX in FIG. 4B is set so as to go through the center of gravity of the entire stage 14 on the XY plane, and each of centers of the pair of the air bearings 66A and 66B provided inside the support brackets 62 shown in FIG. 4 is also positioned on the line KX in the XY plane.

FIG. 4C is a cross-sectional drawing of the part which includes the guiding member 17, the carrier/follower 60, and the magnetic track 56A sectioned from the direction of the arrow 4C in FIG. 2. The arm 24 storing the magnetic track 56A is buoyed up and supported on the base surface 12A by the air bearing 32, and the carrier/follower 60 is buoyed up and supported on the base surface 12A by the air bearing 66. At this time, the height of the air bearing 48 at the bottom surface of the stage body 42 (see FIGS. 3 or 5) and the height of the air bearing 32 are determined so as to place the driving coil 54A on the stage body 42 side keeping a 2–3 mm gap in the Z direction in the slot space of the magnetic track 56A.

Each of the spaces between the carrier/follower 60 and the arm 24 in the Z and Y directions hardly changes because they are both guided by the common guiding member 17 and the base surface 12A. Furthermore, even if there is a difference in the height in the Z direction between the part on the base surface 12A where the air bearing 32 at the bottom surface of the driving frame 22 (arm 24) is guided and the part on the base surface 12A where the air bearing 48 at the bottom surface of the stage body is guided, as long as the difference is precisely constant within the moving stroke, the gap in the Z direction between the magnetic track 56A and the driving coil 54A is also maintained constant.

Furthermore, since the driving coil 68 for the carrier/follower 60 is originally fixed to the carrier/follower 60, it is arranged, maintaining a certain gap of 2–3 mm above and below in the slot space of the magnetic track 56A. The driving coil 68 hardly shifts in the Y direction with respect to the magnetic track 56A.

Cables 82 (see FIG. 2) are provided for directing the signals to the drive coils 54A and 54B on stage 14, the voice coil motor coil 74 and the carrier/follower drive coil 68, and these cables 82 are mounted on the carrier/follower 60 and guide 17 thereby eliminating drag on the reticle stage 14. The voice coil motor 70 acts as a buffer by preventing transmission of external mechanical disturbances to the stage 14.

Therefore, referring now to FIGS. 2 and 4A, the cable issues will be described further in detail. As shown in FIG.

2, a connector 80 which connects wires of the electric system and tubes of the air pressure and the vacuum system (hereafter called "cables") is mounted on the base structure 12 on one end of the guiding member 17. The connector 80 connects a cable 81 from the external control system (including the control system of the air pressure and the vacuum systems besides the electric system control system shown in FIG. 6) to a flexible cable 82. The cable 82 is further connected to the end part 60E of the carrier/follower 60, and electric system wires and the air pressure and the vacuum system tubes necessary for the stage body 42 are distributed as the cable 83.

As mentioned before, the VCM 70 works to cancel a cable's drag or an influence by tension, but sometimes its influence appears as a moment in an unexpected direction between the carrier/follower 60 and the stage body 42. In other words, the tension of the cable 82 gives the carrier/follower 60 a force to rotate the guiding surface of the guiding member 17 or the base surface 12A, and the tension of the cable 83 gives a force to the carrier/follower 60 and the stage body to rotate relatively.

One of these moments, the constituent which shifts the carrier/follower 60, is not problematic, but the one which shifts the stage body in X, Y, or θ direction (yaw rotation direction) could affect the alignment or overlay accuracy. As for the X and θ directions, shifts can be corrected by a consecutive drive by the two linear motors (54A, 56A, 54B, 56B), and as for in the Y direction, the shift can be corrected by the VCM 70. In the present embodiment, since the weight of the entire stage 14 can be reduced substantially, the response of the motion of the stage 14 by VCM 70 in the Y direction and the response by the linear motor in X and θ directions will be extremely high in cooperation with the completely non-contact guideless structure. Furthermore, even when a micro vibration (micron order) is generated in the carrier/follower 60 and it is transferred to the stage 14 via the cable 83, the vibration (from several Hz to tens of Hz) can be sufficiently canceled by the above mentioned high response.

Now, FIG. 4A shows how each of the cables is distributed at the carrier/follower 60. Each of the driving signals to the driving coils 54A, 54B for the stage body 42 and the driving coil 74 of the VCM 70 and the detection signal from the position sensor 13 (the gap sensors 13A, 13B) go through the electric system wire 82A from the connector 80. The pressure gas and the vacuum to each of the air bearings 48 and 66 go through the pneumatic system tube 82B from the connector 80. On the other hand, the driving signal to the driving coils 54A and 54B goes through the electric system wire 83A which is connected to the stage body 42, and the pressurized gas for the air bearing 48 and the vacuum for the clamping member 42C go through the pneumatic system hoses 83B.

Furthermore, it is preferable to have a separate line for the pneumatic system for the air bearings 20, 20' and 32 of the driving frame 22, independent of the one shown in FIG. 2. Also, as shown in FIG. 4A, in case the tension or vibration of the cable 83 cannot be prevented, it is advisable to arrange the cable 83 so as to limit the moment by the tension or vibration the stage body 42 receives only to the Y direction as much as possible. In that case, the moment can be canceled only by the VCM 70 with the highest response.

Referring now to FIGS. 1, 2 and 6, the positioning of the reticle stage 14 is accomplished first knowing its existing position utilizing the laser interferometer system 15. Drive signals are sent to the reticle stage drive coils 54A and 54B for driving the stage 14 in the X direction. A difference in the resulting drive to the opposite sides 42A and 42B of the reticle stage 14 will produce small yaw rotation of the reticle stage 14. An appropriate drive signal to the voice coil 72 of voice coil motor 70 produces small displacements of the reticle stage 14 in the Y direction. As the position of the reticle stage 14 changes, a drive signal is sent to the carrier/follower coil 68 causing the carrier/follower 60 to follow the reticle stage 14. Resulting reaction forces to the applied drive forces will move the magnetic track assembly or drive frame 22 in a direction opposite to the movement of the reticle stage 14 to substantially maintain the center of gravity of the apparatus. It will be appreciated that the counter-weight or reaction movement of the magnetic track assembly 22 need not be included in the apparatus in which case the magnetic track assembly 22 could be fixedly mounted on the base 12.

As described above, in order to control the stage system according to the present embodiment, a control system as shown in FIG. 6 is installed. This control system in FIG. 6 will be further explained in detail here. X1 driving coil and X2 driving coil composed as the driving coils 54A and 54B of two linear motors respectively, and Y driving coil composed as the driving coil 72 of the VCM 70 are placed in the reticle stage 14, and the driving coil 68 is placed in the carrier/follower 60. Each of these driving coils is driven in response to the driving signals SX1, SX2, SY1 and SΔX, respectively, from the position control system 16. The laser interferometer system 15 which measures the coordinates position of the stage 14 comprises the Y axis interferometer which sends/receives the beam LBY, the X1 axis interferometer which sends/receives the beam LBX1, and the X2 axis interferometer which sends/receives the beam LBX2, and they send position information for each of the directions of the axes, IFY, IFX1, IFX2 to the position control system 16. The position control system 16 sends two driving signals SX1 and SX2 to the driving coils 54A and 54B so that the difference between the position information IFX1 and IFX2 in the X direction will become a preset value, or in other words, the yaw rotation of the reticle stage 14 is maintained at the specified amount. Thus, the yaw rotation (in θ direction) positioning by the beams LBX1 and LBX2, X1 axis and X2 axis interferometers, the position control system 16, and the driving signals SX1 and SX2 is constantly being conducted, once the reticle 44 is aligned on the stage body 42, needless to mention the time of the exposure.

Furthermore, the control system 16, which obtained the current coordinate position of the stage 14 in the X direction from the average of the sum of position information IFX1 and IFX2 in the X direction, sends the driving signals SX1, SX2 to the driving coils 54A and 54B, respectively, based on the various commands from the Host CPU 16' and the information CD for the parameters. Especially when scanning exposure is in motion, it is necessary to move the stage 14 straight in the X direction while correcting the yaw rotation, and the control system 16 controls the two driving coils 54A and 54B to give the same or slightly different forces as needed.

Furthermore, the position information IFY from the Y axis interferometer is also sent to the control system 16, and the control system 16 sends an optimum driving signal SΔX to the driving coil 68 of the carrier/follower 60. At that time, the control system 16 receives the detection signal $S_{pd}$ from the position sensor 13 which measures the space between the reticle stage 14 and the carrier/follower 60 in the X direction, and sends a necessary signal SΔX to make the signal $S_{pd}$ into the preset value as mentioned before. The follow-up accuracy for the carrier/follower 60 is not so strict that the detection signal $S_{pd}$ of the control system 16 does not have to be evaluated strictly either. For example, when controlling the motion by reading the position information IFY, IFX1, IFX2 every 1 millisecond from each of the interferometers, the high speed processor in the control system 16 samples the current of the detection signal $S_{pd}$ each time, determines whether the value is large or small compared to the reference value (acknowledge the direction), and if the deviation surpasses a certain point, the signal S$\Delta$X in proportion to the deviation can be sent to the driving coil 68. Furthermore as mentioned before, it is also acceptable to install a control system 95 which directly servo controls the driving coil 68, and directly controls the follow-up motion of the carrier/follower 60 without going through the position control system 16.

Since the moving stage system as shown has no attachment to constrain it in the X direction, small influences may cause the system to drift toward the positive or negative X direction. This would cause certain parts to collide after this imbalance became excessive. The influences include cable forces, imprecise leveling of the base reference surface 12A or friction between components. One simple method is to use weak bumpers (not shown) to prevent excessive travel of the drive assembly 22. Another simple method is to turn off the air to one or more of the air bearings (32, 20) used to guide the drive assembly 22 when the drive assembly reaches close to the end of the stroke. The air bearing(s) can be turned on when the drive begins to move back in the opposite direction.

More precise methods require monitoring the position of the drive assembly by a measuring device (not shown) and applying a driving force to restore and maintain the correct position. The accuracy of the measuring device need not be precise, but on the order of 0.1 to 1.0 mm. The driving force can be obtained by using another linear motor (not shown) attached to the drive assembly 22, or another motor that is coupled to the drive assembly.

Finally, the one or more air bearings (66, 66A, 66B) of the carrier/follower 60 can be turned off to act as a brake during idle periods of the stage 42. If the coil 68 of the carrier/follower 60 is energized with the carrier/follower 60 in the braked condition, the drive assembly will be driven and accelerated. Thus, the position control system 16 monitors the location of the drive assembly 22. When the drive assembly drifts out of position, the drive assembly is repositioned with sufficient accuracy by intermittently using the coil 68 of the carrier/follower 60.

In the first embodiment of the present invention, the driving frame 22 which functions as a counter weight is installed in order to prevent the center of gravity of the entire system from shifting, and was made to move in the opposite direction from the stage body 42. However, when the structures in FIGS. 1–5 are applied to a system where the shift of the center of gravity is not a major problem, it is also acceptable to fix the driving frame 22 on the base structure 12 together. In that case, except for the problem regarding the center of gravity, some of the effects and function can be applied without making any changes.

This invention provides a stage which can be used for high accuracy position and motion control in three degrees of freedom in one plane: (1) long linear motion; (2) short linear motion perpendicular to the long linear motion; and (3) small yaw rotation. The stage is isolated from mechanical disturbances of surrounding structures by utilizing electromagnetic forces as the stage driver. By further using a structure for this guideless stage, a high control bandwidth is attained. These two factors contribute to achieve the smooth and accurate operation of the stage.

Figure 7:
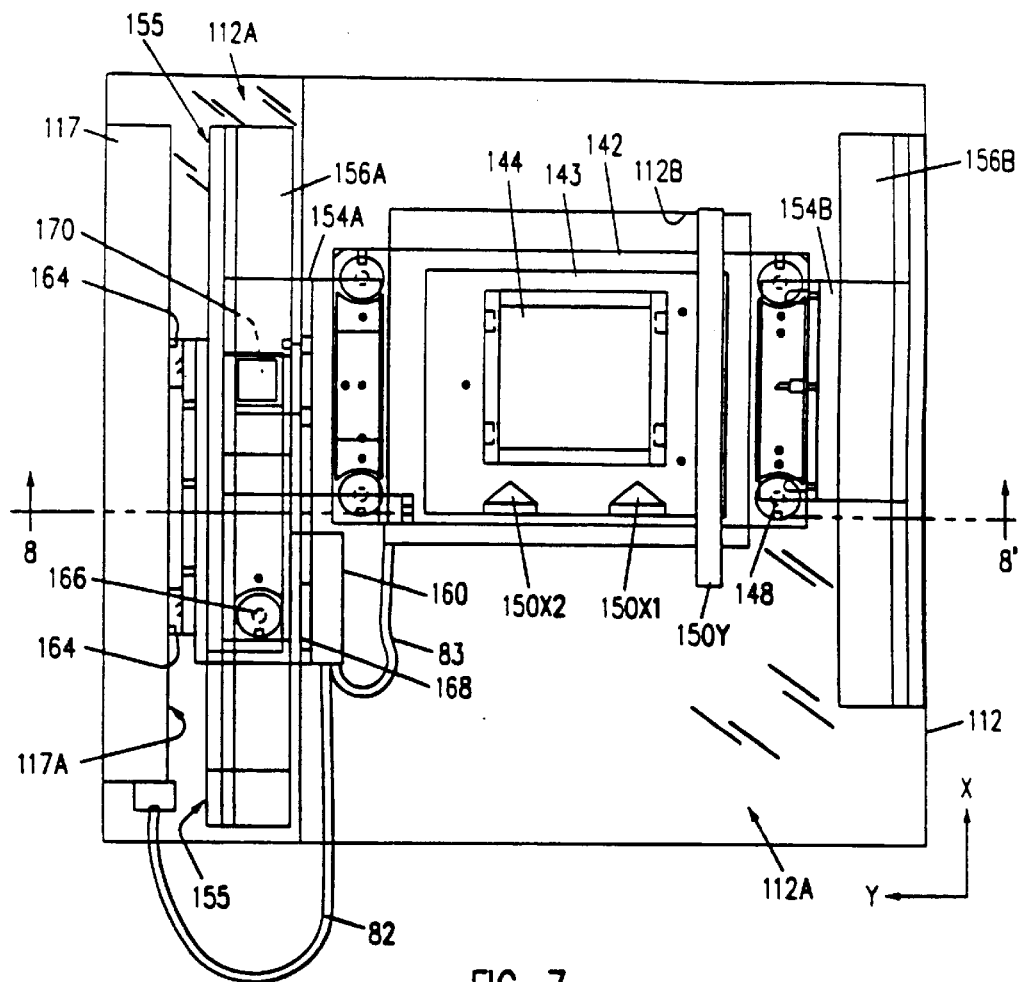
FIG. 7 is a plan view, similar to FIG. 2, illustrating a preferred embodiment of the present invention.
Figure 8:
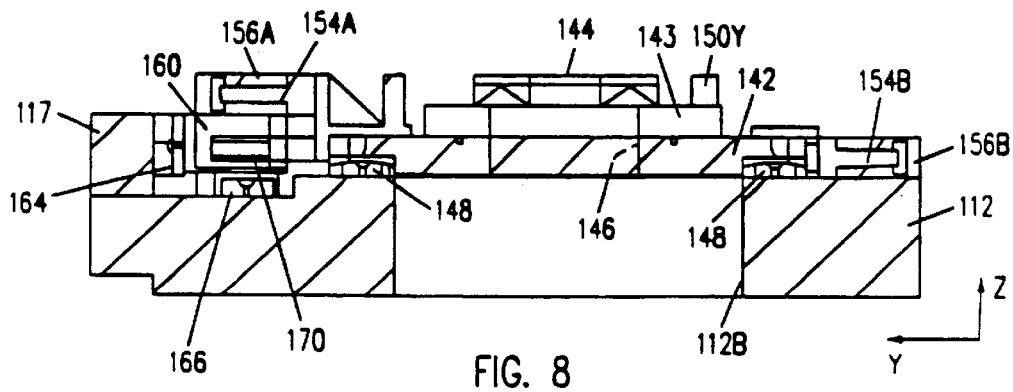
FIG. 8 is an elevational sectional view of the structure shown in FIG. 7 taken along line 8–8' in the direction of the arrows.

Bearing in mind the description of the embodiment illustrated in FIGS. 1–6, one preferred embodiment of the present invention is illustrated in FIGS. 7 and 8, wherein the last two digits of the numbered elements are similar to the corresponding two digit numbered elements in FIGS. 1–5.

In FIGS. 7 and 8, differing from the previous first embodiment, the driving frame which functions as a counter weight is removed, and each of the magnet tracks 156A and 156B of the two linear motors is rigidly mounted onto the base structure 112. The stage body 147 which moves straight in the X direction is placed between the two magnetic tracks 156A and 156B. As shown in FIG. 8, an opening 112B is formed in the base structure 112, and the stage body 142 is arranged so as to straddle the opening 112B in the Y direction. There are four pre-loaded air bearings 148 fixed on the bottom surface at both ends of the stage body 142 in the Y direction, and they buoy up and support the stage body 142 against the base surface 112A.

Furthermore, according to the present embodiment, the reticle 144 is clamped and supported on a reticle chuck plate 143 which is separately placed on the stage body 142. The straight mirror 150Y for the Y axis laser interferometer and two corner mirrors 150X1, 150X2 for the X axis laser interferometer are mounted on the reticle chuck plate 143. The driving coils 154A and 154B are horizontally fixed at both ends of the stage body 142 in the Y direction with respect to the magnetic tracks 156A and 156B, and due to the control subsystem previously described, make the stage body 142 run straight in the X direction and yaw only to an extremely small amount.

As evident from FIG. 8, the magnetic track 156B of the right side of the linear motor and the magnetic track 156A of the left side of the linear motor are arranged so as to have a difference in level in the Z direction between them. In other words, the bottom surface of both ends in the direction of the long axis of the magnetic track 156 on the left side is, as shown in FIG. 7, elevated by a certain amount with a block member 155 against the base surface 112A. The carrier/follower 160 where the VCM 170 is fixed is arranged in the space below the elevated magnetic track 156A.

The carrier/follower 160 is buoyed up and supported by the pre-loaded air bearings 166 (at 2 points) on the base surface 112A' of the base structure 112 which is one level lower. Furthermore, two pre-loaded air bearings 164 against the vertical guiding surface 117A of the straight guiding member 117, which is mounted onto the base structure 112, are fixed on the side surface of the carrier/follower 160. This carrier/follower 160 is different from the one in FIG. 4A according to the previous embodiment, and the driving coil 168 (FIG. 7) for the carrier/follower 160 is fixed horizontally to the part which extends vertically from the bottom of the carrier/follower 160, and positioned in the magnetic flux slot of the magnetic track 156A without any contact. The carrier/follower 160 is arranged so as not to contact any part of the magnetic track 156A within the range of the moving stroke, and has the VCM 170 which positions the stage body 142 precisely in the Y direction.

Furthermore, in FIG. 7, the air bearing 166 which buoys up and supports the carrier/follower 160 is provided under the VCM 170. The follow-up motion to the stage body 142 of the carrier/follower 160 is also done based on the detection signal from the position sensor 13 as in the previous embodiment.

In the second embodiment structured as above, there is an inconvenience where the center of gravity of the entire system shifts in accordance with the shift of the stage body 142 in the X direction, since there is substantially no member which functions as a counter weight. It is, however, possible to position the stage body 142 precisely in the Y direction with non-contact electromagnetic force by the VCM 170 by way of following the stage body 142 without any contact using the carrier/follower 160. Furthermore, since the two linear motors are arranged with a difference in the level in the Z direction between them, there is a merit where the sum of the vectors of the force moment generated by each of the linear motors can be minimized at the center of gravity of the entire reticle stage because the force moment of each of the linear motors substantially cancels with the other.

Furthermore, since an elongated axis of action (the line KX in FIG. 4B) of the VCM 170 is arranged so as to pass through the center of gravity of the entire structure of the stage not only on the XY plane but also in the Z direction, it is more difficult for the driving force of the VCM 170 to give unnecessary moment to the stage body 142. Furthermore, since the method of connecting the cables 82, 83 via the carrier/follower 160 can be applied in the same manner as in the first embodiment, the problem regarding the cables in the completely non-contact guideless stage is also improved.

Figure 9:
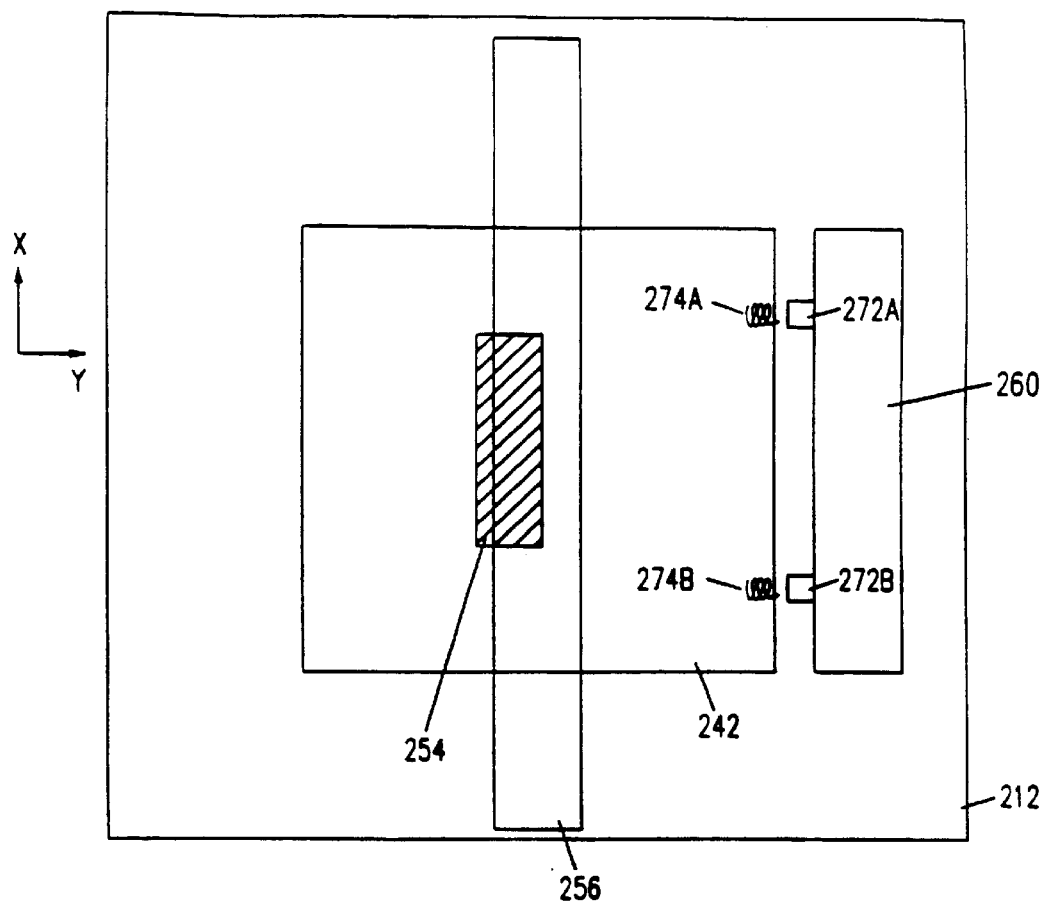
FIGS. 9 and 10 are simplified schematic views similar to FIGS. 7 and 8 and illustrating still another embodiment of the present invention.
Figure 10:
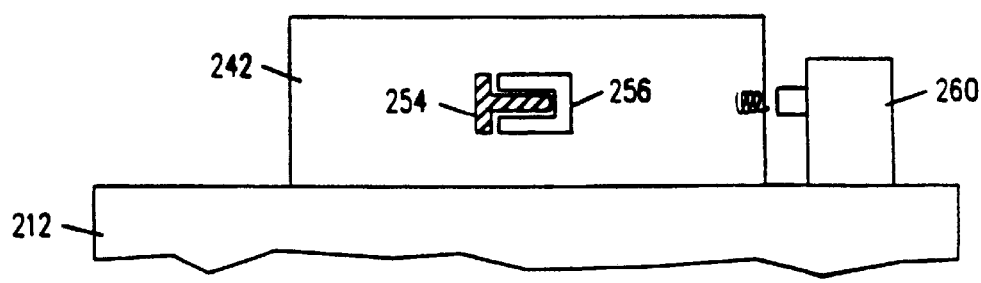

The same guideless principle can be employed in another embodiment. For example, in schematic FIGS. 9 and 10, the stage 242, supported on a bases 212, is driven in the long X direction by a single moving coil 254 moving within a single magnetic track 256. The magnetic track is rigidly attached to the base 212. The center of the coil is located close to the center of gravity of the stage 242. To move the stage in the Y direction, a pair of VCMs (274A, 274B, 272A, 272B) are energized to provide an acceleration force in the Y direction. To control yaw, the coils 274A and 274B are energized differentially under control of the electronics subsystem. The VCM magnets (272A, 272B) are attached to a carrier/follower stage 260. The carrier/follower stage 260 is guided and driven like the first embodiment previously described. This alternative embodiment can be utilized for a wafer stage. Where it is utilized for a reticle stage the reticle can be positioned to one side of the coil 254 and track 256, and if desired to maintain the center of gravity of the stage 242 passing through the coil 254 and track 256, a compensating opening in the stage 242 can be provided on the opposite side of the coil 254 and track 256 from the reticle.

Merits gained from each of the embodiments can be roughly listed as follows. To preserve accuracy, the carrier/follower design eliminates the problem of cable drag for the stage since the cables connected to the stage follow the stage via the carrier/follower. Cables connecting the carrier/follower to external devices will have a certain amount of drag, but the stage is free from such disturbances since there is no direct connection to the carrier/follower which acts as a buffer by denying the transmission of mechanical disturbances to the stage.

Furthermore, the counter-weight design preserves the location of the center of gravity of the stage system during any stage motion in the long stroke direction by using the conservation of momentum principle. This apparatus essentially eliminates any reaction forces between the stage system and the base structure on which the stage system is mounted, thereby facilitating high acceleration while minimizing vibrational effects on the system.

In addition, because the stage is designed for limited motion in the three degrees of freedom as described, the stage is substantially simpler than those which are designed for full range motions in all three degrees of freedom. Moreover, unlike a commutatorless apparatus, the instant invention uses electromagnetic components that are commercially available. Because this invention does not require custom-made electromagnetic components which become increasingly difficult to manufacture as the size and stroke of the stage increases, this invention is easily adaptable to changes in the size or stroke of the stage.

The embodiment with the single linear motor eliminates the second linear motor and achieves yaw correction using two VCMs.

The following explains another embodiment of this invention with reference to FIGS. 11–29B. In this example, the invention is applied to a step-and-scan type projection exposure apparatus.

Figure 11:
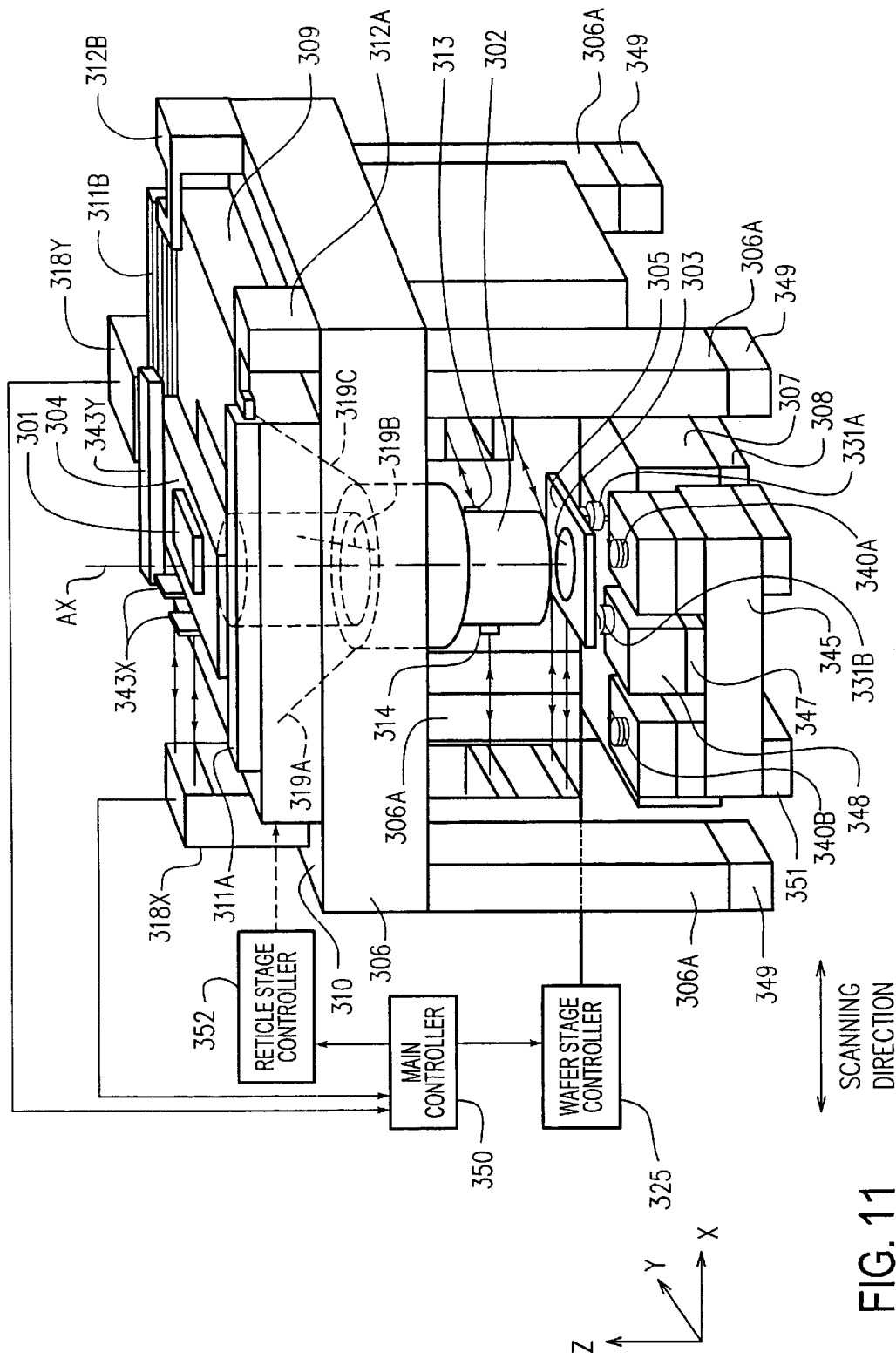
FIG. 11 is a perspective view showing a schematic structure of a projection exposure apparatus according to an embodiment of this invention.

FIG. 11 shows a projection apparatus of this example. In this figure, during exposure, exposure light such as i rays of a mercury lamp, excimer laser light or the like such as KrF, ArF, $F_2$, or the like from an illumination optical system (not depicted) illuminates an illumination area of a pattern face of a reticle 301. Furthermore, a pattern image within the illumination area of the reticle 301 is projected and exposed on the top of the wafer 303 on which photoresist is coated, at a predetermined projection magnification $\beta$($\beta$ is normally ¼, ⅕, or the like) through a projection optical system 302. Hereafter, an explanation is given with the Z-axis defined as being parallel to an optical axis AX of the projection optical system 302 in a non-vibrating state, and with the X-axis and Y-axis defining a perpendicular coordinate system within a plane perpendicular to the optical axis AX.

First, the reticle 301 is held on the reticle stage 304, and when the reticle stage 304 continuously moves in the X direction (scanning direction) by a linear motor method on the reticle base 309, a micro-adjustment of the position of the reticle 301 is performed within the XY plane. The two-dimensional position of the reticle stage 304 (reticle 301) is measured by moving mirrors 343X and 343Y and laser interferometers 318X and 318Y on the reticle stage 304. This measured value is supplied to a main controller 350 comprising a computer that controls an operation of the device as a whole. The main controller 350 controls the position and the moving speed of the reticle stage 4 through the reticle stage controller 352, based upon the measured value.

Meanwhile, a wafer 303 is held on top of a wafer stage 305 by vacuum absorption, and the wafer stage 305 is disposed on a wafer base 307 via three support legs 331A–331C, which can freely extend and retract within a specified range in the Z direction. The extending or retracting amount of the support legs 331A–331C is controlled by a support leg controller 363 (see FIG. 26). By making the extending or retracting amount of the support legs 331A–331C the same, the position of the Z direction of the wafer 303 (focus position) is controlled. Controlling of the tilt angle (leveling) of the surface of the wafer 303 can be performed by controlling the extending or retracting amount of the support legs 331A–331C independently.

The wafer stage 305 can continuously move on the wafer base 307 in the X and Y directions by, for example, a linear motor method. Additionally, stepping can also be performed by the continuous movement. Furthermore, in order to perform coordinate measurement of the wafer 303 (wafer stage 305), an X-axis moving mirror 344X (see FIG. 13) with a reflecting surface that is substantially perpendicular to the X-axis and a Y-axis moving mirror 344Y (see FIG. 13)

with a reflecting surface that is substantially perpendicular to the Y-axis are fixed to a side surface of the wafer stage 305. Corresponding to these moving mirrors, an X-axis reference mirror 314 and a Y-axis reference mirror 313 are fixed to a side surface of the projection optical system 302.

During scanning exposure, the reticle stage 304 is moved at constant velocity in the X-axis direction and, in synchronization with this movement, the wafer stage 305 on which the wafer 303 is disposed is moved in the opposite direction at a speed that is reduced by the projection magnification β of the moving speed of the reticle stage 304, and scanning exposure is performed. After completion of the scanning exposure, the wafer stage 305 step-moves in the scanning direction or in the Y-axis direction that is perpendicular to the scanning direction. The reticle stage 304 and the wafer stage 305 are moved in synchronization in a direction opposite to the previous direction, and scanning exposure is performed. Hereafter, a pattern image of the reticle 301 is transferred to all the shooting areas on the wafer 303 by the same operation.

Next, the reticle stage and the reticle base of the exposure apparatus of this example are explained. The reticle stage 304 is a guideless stage which is disclosed in Japanese Laid-Open Patent Publication No. 8-63231 (corresponding to U.S. parent application Ser. No. 08/698,827) and can be driven in rotational directions about the optical axis AX of the projection optical system 302 and about the X- and the Y-axes. Furthermore, a pair of linear motors that drive the reticle stage 304 using a coil, which are fixed to a side surface of the reticle stage 304, and a pair of motor magnets 311A and 311B, which are fixed to the top of the reticle base 309 are provided, and the reticle base 309 is supported through a fluid bearing (not depicted) such as an air bearing with respect to a top surface 310 of a structural body 306. Ends of coil units 312A and 312B disposed on the top of the structural body 306 are inserted from ends of the motor magnets 311A and 311B, and by the pair of linear motors structured by the motor magnets 311A and 311B and the coil units 312A and 312B, the reticle base 309 is positioned in the X-axis direction with respect to the structural body 306. Furthermore, the structural body 306 is supported on the floor by vibration control pads 349 through four legs 306a, decreasing the vibration from the floor.

When the reticle stage 304 moves during the scanning exposure, when the driving reaction added by the motor magnets 311A and 311B is received, the reticle base 309 moves, so as to maintain a momentum in the direction opposite to the moving direction of the reticle stage 304, by the linear motor that has the coil units 312A and 312B. For example, if the masses of the reticle stage 304 and the reticle base 309 are 20 kg and 1000 kg, respectively, and the reticle base 309 thus has a mass 50 times that of the reticle stage 304, if the reticle stage 304 moves by approximately 300 mm during scanning, the reticle base 309 moves in the direction opposite to the moving direction of the reticle stage 304 by approximately 6 mm. By moving the reticle stage 304 and the reticle base 309, so as to maintain the momentum, transmission of the driving reaction to the structural body 306 of the reticle stage 304 can be prevented, and occurrence of vibration, which is a cause of disturbance during the positioning of the reticle stage 304, can be prevented. Furthermore, the displacement amount of the reticle base 309 is constantly measured by a linear encoder (not depicted), and a current signal is formed when the reticle stage 304 is driven, based upon this measured value.

Furthermore, in the projection exposure apparatus of this example, there is no movement of the center of the gravity of the system above the reticle base 309, so there is no fluctuation of the load to the structural body 306 that supports the reticle base 309, and the position of the reference mirrors 313 and 314 used for the measurement of the relative position between the reticle stage 304 and the projection optical system 302 does not fluctuate. Furthermore, when the reticle base 309 is displaced a specified amount or more, if it mechanically interferes with other members, it is acceptable to constantly maintain the reticle base 309 at a substantially constant position while controlling the coil units 312A and 312B, which are electromagnetic driving parts disposed between the reticle base 309 and the structural body 306, and decreasing the vibration transmitted to the structural body 306. By doing this, it is possible to prevent the reticle base 309 from interfering with other members.

Figure 12:
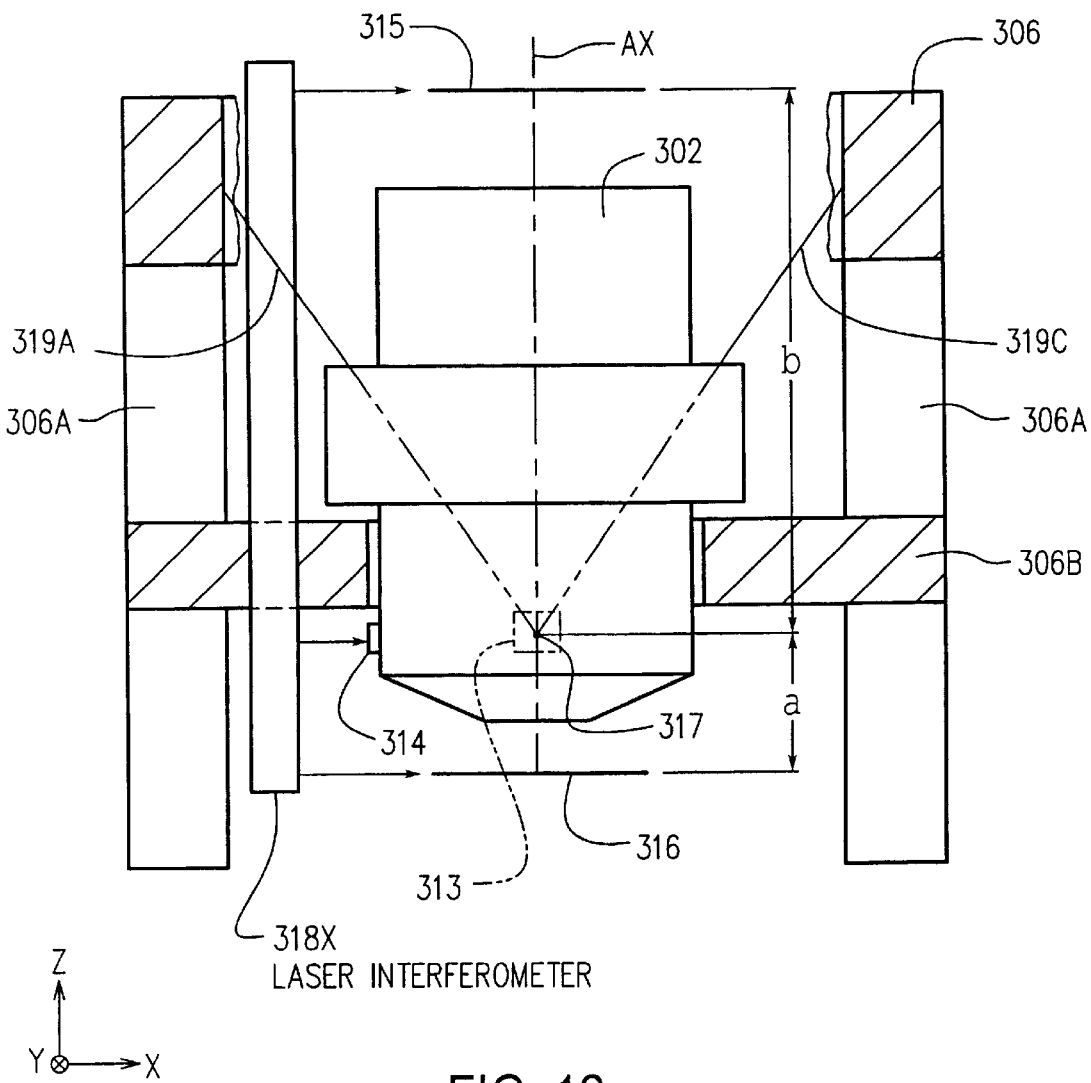
FIG. 12 is a cross-sectional view taken through a part showing a method of supporting the projection optical system of FIG. 11.

Next, a method of supporting the projection optical system of the exposure apparatus of this example is explained. FIG. 12 shows the projection optical system 302 of the exposure apparatus of this example. In this figure, the point at which the object plane 315 and the image surface 316 are internally divided at the reduction projection magnification ratio β(=a/b) on the optical axis AX is defined as a reference point 317 of the projection optical system 302. This reference point 317 is defined as a center, and even if the projection optical system 302 is minutely rotated about an arbitrary axis within a plane that is orthogonal to the optical axis AX, the position relationship between the object plane 315 and the image surface 316 does not change. The centers of the reference mirrors 313 and 314 are set on a plane perpendicular to the optical axis AX which pass through this reference point 317, and a laser beam is irradiated to these centers. Accordingly, when the projection optical system 302 is slid by a disturbance vibration, the reference point 317 also moves. Furthermore, the relative displacement between the reticle stage 304 and the wafer stage 305 and the crossing point (reference mirrors 313 and 314) of the plane perpendicular to the optical axis AX of the projection optical system 302 and the external surface of the lens barrel surrounding the projection optical system 302 are constantly measured by the laser interferometers 318X and 318Y. By controlling the reticle stage 304 and the wafer stage 305 so as to match the measured value with a desired value, it is possible to prevent position shifting of a pattern to be formed on the wafer 302.

Furthermore, the bottom part of the projection optical system 302 passes through an opening of a support plate 306b which is disposed between the legs 306a, and is spaced from the opening by a gap. Additionally, the support part of the projection optical system 302 is formed by three flexible rods 319A–319C extending from the structural body 306. The extended lines of the respective rods 319A–319C cross at one point, which coincides with the reference point 317. Accordingly, even if the projection optical system 302 is slid by receiving a disturbance vibration, the projection optical system 302 is minutely rotated using the center of the reference point 317 as a center of rotation, so the position in the X and Y directions of the reference mirrors 313 and 314 hardly changes. Furthermore, because the rods 319A–319C are flexibly structured, high frequency vibrations dissipate, and hardly any deterioration of the contrast occurs during transfer of the pattern.

Next, the wafer stage of the exposure apparatus of this example is explained.

Figure 26:
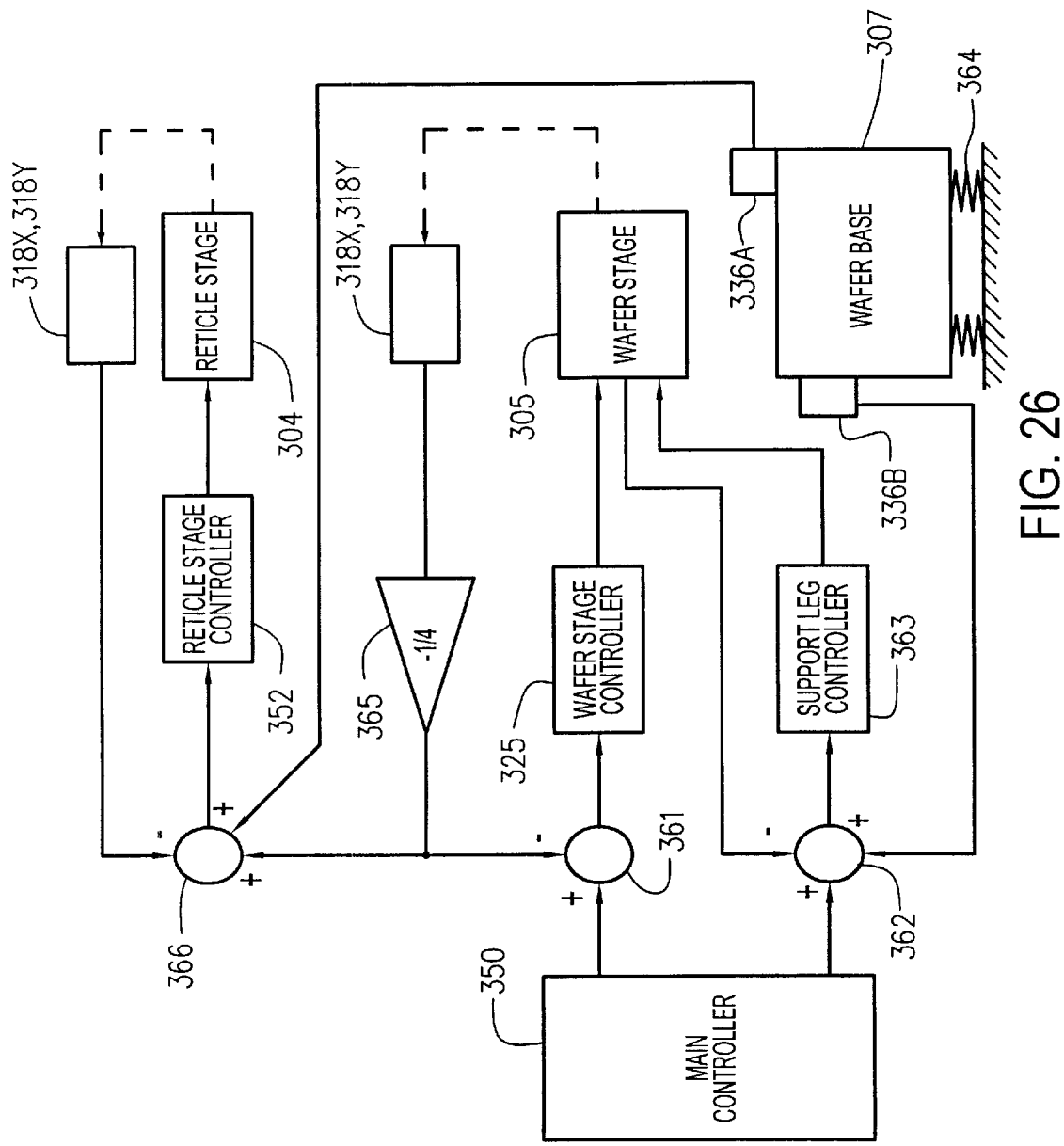
FIG. 26 is a block diagram showing a structure of a controller that controls a reticle stage, a wafer stage, and a wafer base.

As shown in FIG. 11, the wafer stage 305 is positioned on top of the wafer base 307, and the wafer base 307 is supported by an elevator driving part 308 that can displace several hundred μm in the vertical direction. Between the wafer base 307 and the elevator driving part 308, a viscoelastic body (not depicted) is provided, and vibration from the floor can be decreased. In addition, on the wafer base 307, five speed sensors (two of the five speed sensors, 336A and 336B, are shown in FIG. 26) are provided, and the movement of the wafer stage 305 can be measured. It is also acceptable to use acceleration sensors instead of speed sensors.

FIGS. 13A–13D show the wafer stage 305 of the exposure apparatus of this example by enlargement. FIG. 13A is a plan view of the wafer table 320. FIG. 13B is a cross-sectional view of FIG. 13A along line B—B. FIG. 13C is a front view (however, a carrier 321 is not depicted) of FIG. 13A. FIG. 13D is a cross-sectional view of FIG. 13A along line D—D. First, in FIG. 13D, the wafer stage 305 has a wafer table 320 on which a wafer 303 is disposed and a carrier 321 that carries a driving/guiding part of the wafer table 320. The carrier 321 is movable on the wafer base 307 and can be driven in the X and Y directions by a pulse motor type of planar motor (for example, a Sawyer motor). In this example, when the carrier 321 is driven, a pulse motor (not depicted) is used to supply pulses according to the distance to a desired position by the open loop method. Because the pulses to a desired position is output to a motor controller, it is not necessary to provide a new position measurement device for the carrier 321. Furthermore, it is also acceptable to use an ultrasonic wave motor as a flat motor.

Meanwhile, as shown in FIG. 13A, on the top surface of the wafer table 320, a plurality of parallel shallow grooves 339 are disposed to vacuum absorb the wafer 303. Many holes in the shallow grooves 339 are in communication with a vacuum pump, which is not depicted. Furthermore, deep grooves 338 to receive the wafer carrier arms, described later, are disposed in spaces between four shallow grooves 339 without interfering with the shallow grooves 339. When a wafer 303 is fixed on the wafer table 320, the wafer carrier arm used as the carrier of the wafer 303 can be taken in and out without interfering with the wafer table 320.

Furthermore, as shown in FIG. 13B, a guide shaft 322B is disposed in the scanning direction (X direction) via a support member 322C on the carrier 321. A guide member 322A is fixed to the bottom surface of the wafer table 320, with the guide shaft 322B passing therethrough. The wafer table 320 is restricted by a noncontact guide (for example, a fluid bearing or a magnetic bearing) comprising the guide member 322A, which guides the wafer table 320 on the carrier 321 in the X direction, and the guide shaft 322B. Furthermore, in FIG. 13D, a pair of linear motors 323A, 324A, and 323B, 324B are structured by coils 323A and 323B fixed to the carrier 321 and magnets 324A and 324B fixed to the bottom surface of the wafer table 320. The wafer table 320 is driven in the Y direction and the rotational direction by the linear motors 323A, 324A, and 323B, 324B, which serve as non-contact electromagnetic driving parts. The displacement of the wafer table 320 with respect to the carrier 321 is measured by a linear encoder (not depicted), which serves as a non-contact position measurement device. Furthermore, the guide shaft 322B is structured so as to be rotatable about the guide axis by a rotation member 322D. Additionally, when the linear motors 323A, 324A and 323B, 324B generate a driving force in the same direction, the wafer table 320 moves in the guide axis direction (X direction). Conversely, when the linear motors 323A, 324A, and 323B, 324B generate a driving force in different directions, respectively, the wafer table 320 is rotated about the center of gravity.

The center of the thrust of the linear motors 323A, 324A, and 323B, 324B and the center of the guide member 322A are disposed so that they can be positioned in a plane parallel to the top surface of the wafer base 307, and includes the center of gravity of the wafer table 320. Therefore, unnecessary inclination of the wafer table does not occur at the time of acceleration of the wafer table 320. Furthermore, the size of the guide shaft 22B and the linear motors 323A, 324A, and 323B, 324B, only needs to be long enough for the movement of the wafer during the scanning exposure. Therefore, the size can be small so as to store the carrier 321 below the wafer table 320, and the wafer can be moved at high speed with high accuracy.

Furthermore, because the positioning accuracy needed for receiving the wafer 303 is approximately several μm, measurement by a laser interferometer is not particularly needed in the area that receives the wafer 303, and the resolution of the pulse motor and/or the resolution of the position measurement device of the carrier 321 is sufficient. Therefore, the moving mirrors 344X and 344Y which are provided for the wafer table 320 of FIG. 13 for the laser interferometers 318X and 318Y do not necessarily have to cover the entire moving area of the wafer table 320. Only the length of the area in which precise positioning in nm units is needed, that is, the length of the diameter of the wafer 303, is needed.

The moving mirrors 344X and 344Y for the laser interferometer 318 are disposed on side surfaces of the wafer table 320 of this example, and the rotational angle about the Z-axis and the position of the wafer table 320 are measured. Side surfaces of the wafer table 320 are used as moving mirrors 344X and 344Y for the laser interferometers 318X and 318Y, so the wafer table 320 is of a size that substantially circumscribes the wafer 303, and it is extremely small and light, compared to a conventional wafer table. Furthermore, when the wafer table 320 is structured so as to dispose a rib structure in the bottom surface with a thickness of approximately 3 mm by using a silicon carbide, the weight of the wafer table 320 is approximately 5 kg.

Figure 14:
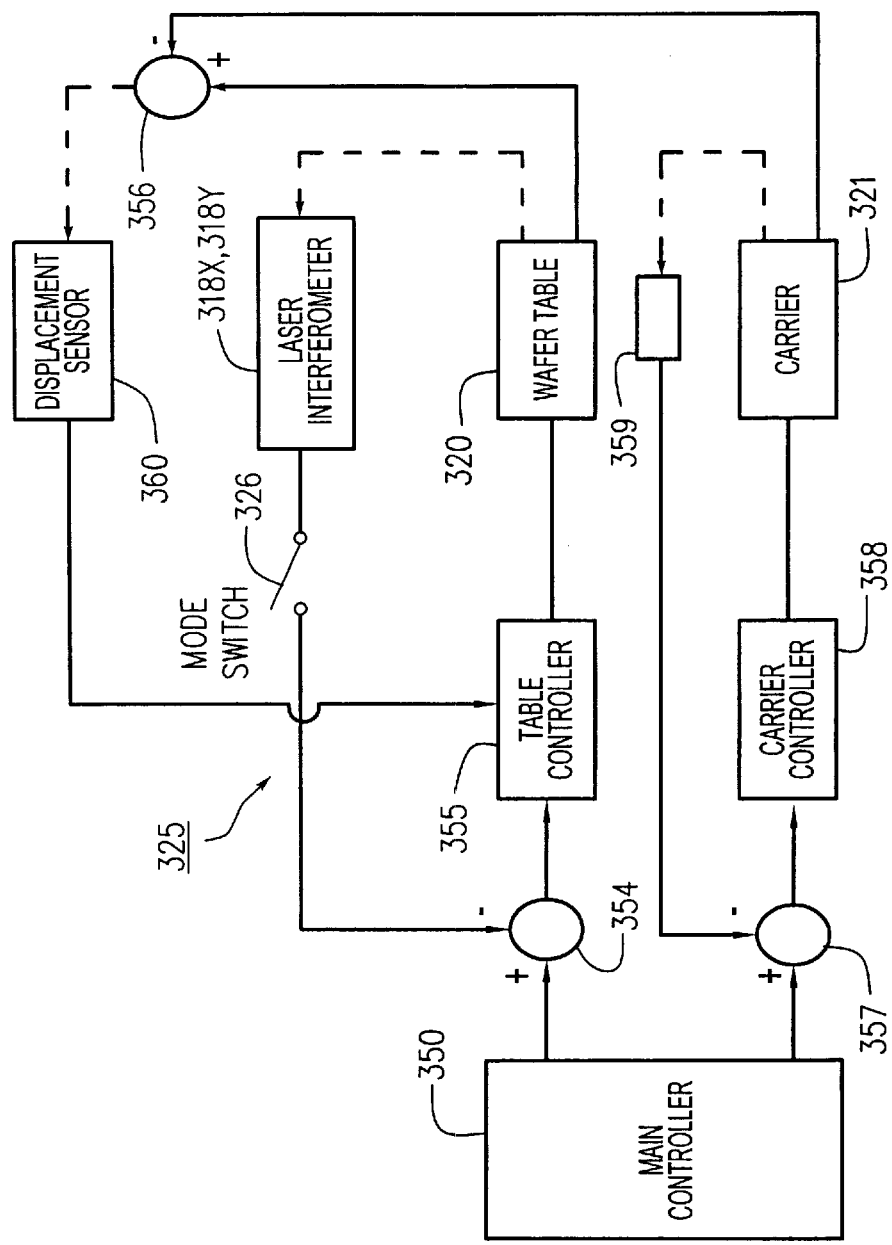
FIG. 14 is a block diagram showing a structure of a controller that controls a wafer table and a carrier.

FIG. 14 is a block diagram showing a structure of a controller that controls both the wafer table 320 and the carrier 321. In FIG. 14, the main controller 350 supplies desired positions of the carrier 321 and the wafer table 320, respectively, to subtractors 354 and 357 within the wafer stage controller 325. Furthermore, the relative displacement amount of the wafer table 320 with respect to the carrier 321 is detected by a hypothetical subtractor 356 and a displacement sensor (linear encoder) 360. A table controller 355 drives the wafer table 320, based upon the output of the subtractor 354 and the displacement sensor 360, and the carrier controller 358 drives the carrier 321 based upon the output of the subtractor 357. The subtractor 354 outputs a value corresponding to the measured value of the laser interferometers 318X and 318Y subtracted from the desired value, and the subtractor 357 outputs a value that corresponds to the measured value of a hypothetical linear encoder 359 for the carrier 321 subtracted from the desired value.

When the laser interferometers 318X and 318Y (see FIG. 11) are not used while the mode switch 326 is OFF, that is, in the case of the approximate positioning, based upon the signal from the displacement sensor 360 that serves as a linear encoder, the wafer stage controller 325 controls the linear motors 323A, 324A and 323B, 324B of FIGS. 13A–13D so as to constantly position the wafer table 320 at the middle point of the moving range with respect to the carrier 321. Furthermore, when the driving part of the carrier 321 has an encoder 359, the carrier controller 358 moves the carrier 321 to a desired position with reference to the encoder 359. When an encoder is not especially provided, such as in the case of a pulse motor in this example, pulses to a desired position are output to the motor controller and the carrier 321 is controlled. Therefore, regardless of the existence of an encoder, the wafer table 320 is controlled so as to be moved while following the movement of carrier 321.

When the mode switch 326 of FIG. 14 is in the ON state and the wafer table 320 moves based upon the measured value of the laser interferometers 318X and 318Y, that is, in the case of precise positioning, based upon the output of the subtractor 354, which references the measured value of the laser interferometers 318X and 318Y, the table controller 355 causes the linear motors 323A, 324A and 323B, 324B to generate thrust with respect to the wafer table 320, and causes the wafer table 320 to move. Furthermore, the carrier 321 is controlled just like in the approximate positioning.

When the wafer table 320 moves at constant velocity while using the laser interferometers 318X and 318Y, that is, at the time of scanning exposure, the table controller 355 causes the linear motors 323A, 324A and 323B, 324B to generate thrust and move the wafer table 320 while referring to the output of the subtractor 354, which has subtracted the measured value of the laser interferometers 318X and 318Y. At this time, the carrier 321 maintains a still state, and only the wafer table 320 moves at a constant velocity. Therefore, it is only the light weight wafer table 320 that generates the driving reaction with respect to the wafer base 307 during the scanning exposure, so the disturbance reaction to be generated becomes extremely small, and scanning exposure can be performed at high speed with high accuracy.

Next, the guide member 322A and the guide shaft 322B of the wafer table 320 of the exposure apparatus of this example are explained.

Figure 15A:
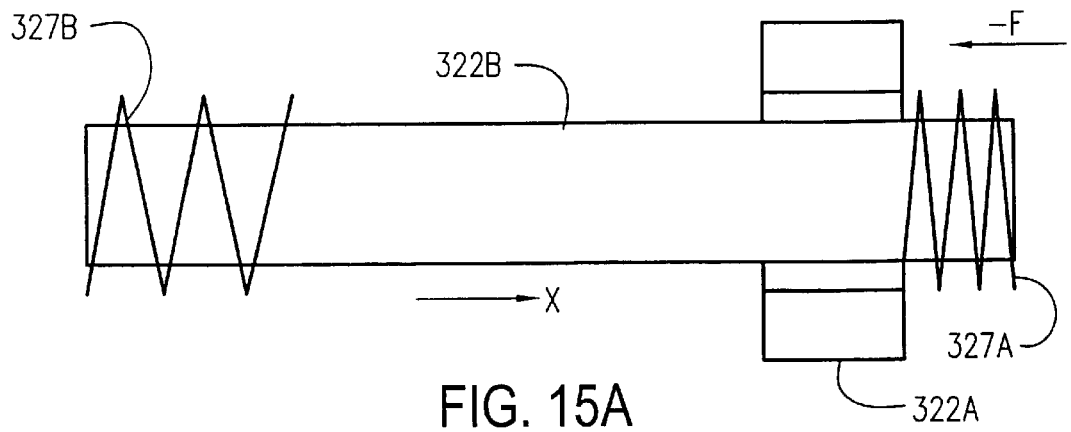
FIGS. 15A–C are schematic diagrams that accompany an operation explanation of a guide shaft and a guide member of the wafer table of FIGS. 13A–C.
Figure 15B:
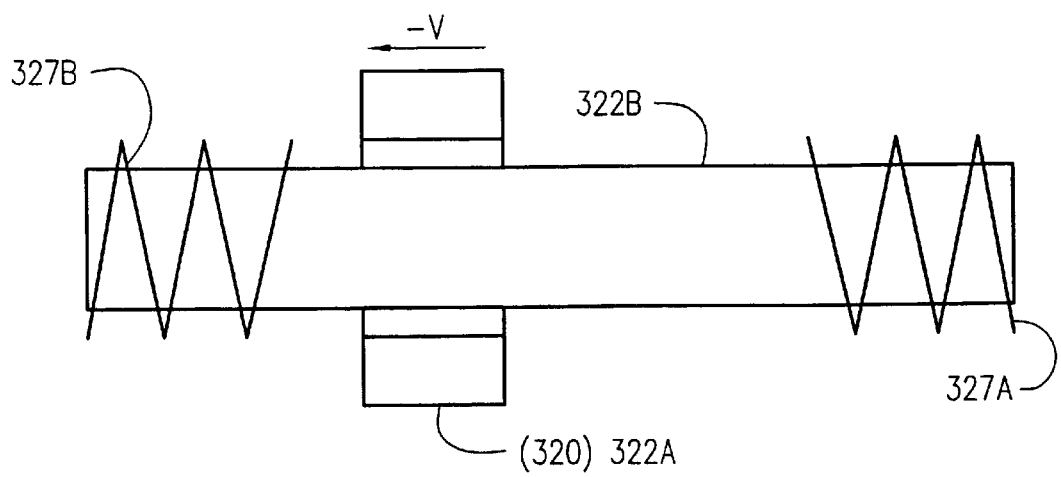
Figure 15C:
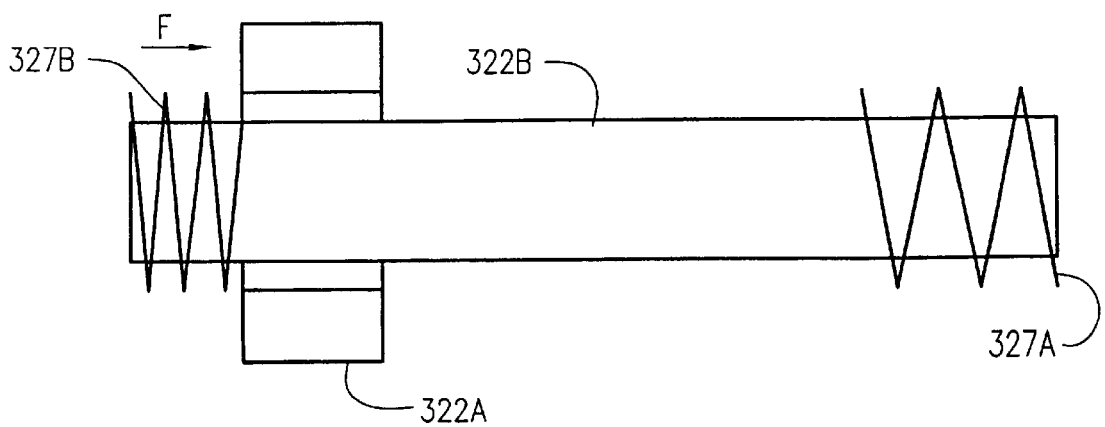

FIG. 15A–C show the guide member 322A and the guide shaft 322B of FIGS. 13A–D by enlargement. In this figure, springs 327A and 327B are provided as elastic bodies at both ends of the guide shaft 322B. When the wafer table 320 reciprocates with respect to the carrier 321, first, as shown in FIG. 15A, kinetic energy of the wafer table 320 is converted to potential energy via the guide member 322A and is stored in the spring 327A. Next, as shown in FIG. 15B, the potential energy that has been stored in the spring 327A is again converted to kinetic energy of the wafer table 320, and the wafer stage controller 325 of FIG. 11 controls the wafer table 320 using the kinetic energy so that it moves the wafer table 320 at the speed of −V. Furthermore, as shown in FIG. 15C, when the support member 322A contacts the spring 327B, an opposing force of +F occurs in the spring 327B and the kinetic energy of the wafer table 320 is again converted to potential energy and is saved in the spring 327B. Therefore, mechanical energy to be consumed in the case of reciprocation of the wafer table 320 is mainly only the heat from the viscosity resistance of the wafer table 320 with respect to the air, and from when the elastic bodies are deformed. Thus, the heating amount of the linear motors 323A, 324A, and 323B, 324B becomes extremely small.

Figure 16A:
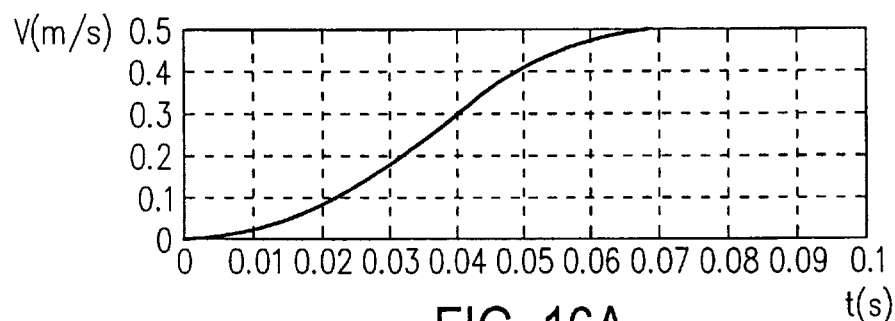
FIG. 16A is a diagram showing the speed of the wafer table when the moving speed of the wafer table is shifted to a constant speed on a guide axis without an elastic body.
Figure 16B:
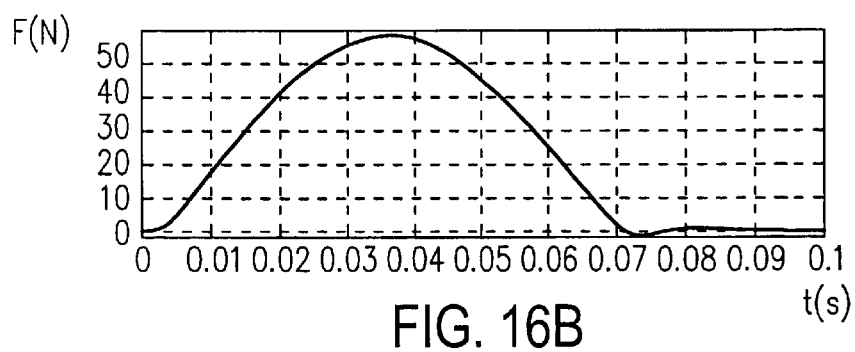
FIG. 16B is a diagram showing thrust of linear motors.
Figure 17A:
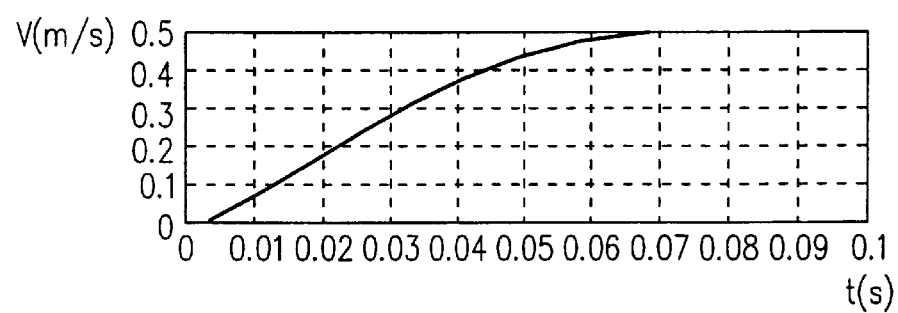
FIG. 17A is a diagram showing a speed curve of a wafer table that is calculated assuming the case where an ideal wafer table without vibration is accelerated to a constant speed on a guide axis with springs.
Figure 17B:
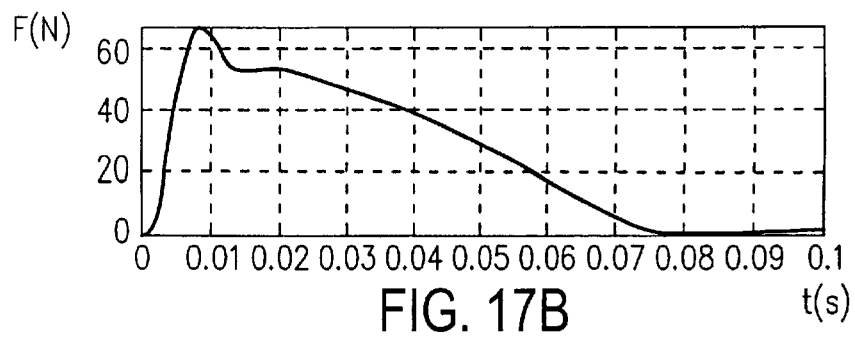
FIG. 17B is a diagram showing thrust of linear motors which is calculated assuming the case where a wafer table with vibration is controlled taking the speed curve of FIG. 17A as a speed governing value.

FIG. 16A shows a speed curve of the wafer table 320 when the moving speed of the wafer table 320 is shifted to a constant speed (0.5 m/s) and is moved on the guide shaft 322B, which is hypothetically defined as a guide axis without an elastic body. In FIG. 16A, the horizontal axis shows time t (s), and the vertical axis shows the moving speed V (m/s) of the wafer table 320. Furthermore, FIG. 16B shows the thrust of the linear motors 323A, 324A and 323B, 324B at that time. In FIG. 16B, the horizontal axis is time t (s), and the vertical axis is a thrust F(N) of the linear motors. Furthermore, the mass of the wafer table 320 which is used is 5 kg. FIG. 17A corresponds to FIG. 16A and shows a speed curve of the wafer table 320 calculated assuming the case where an ideal wafer table 320 without vibration is accelerated to a certain speed on the guide axis provided with a specified spring. FIG. 17B shows a thrust F(N) of the linear motors 323A, 324A and 323B, 324B, which is calculated assuming the case where a wafer table 320 that resonates is controlled with the speed curve of FIG. 17A as the speed governing value. When FIGS. 16A–B are compared with FIGS. 17A–B, the ratio of the heating amount of the linear motors 323A, 324A, and 323B, 324B is 1:0.94, which is substantially the same.

Figure 18A:
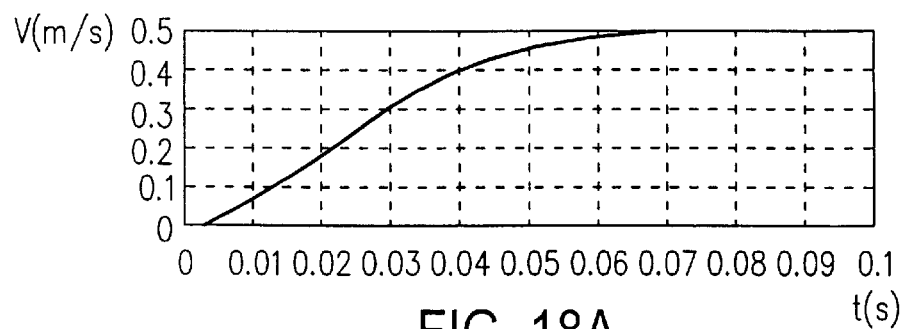
FIG. 18A is a diagram showing the speed when a wafer table is accelerated to a constant speed using a guide axis with springs, taking the speed curve of FIG. 17A as a speed governing value.
Figure 18B:
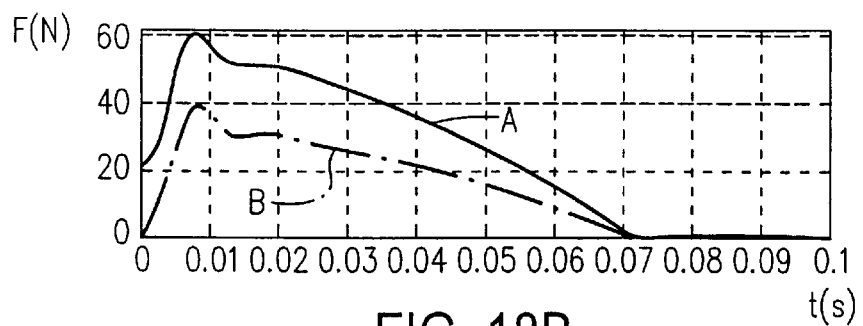
FIG. 18B is a diagram showing thrust of a wafer table at that time and the thrust generated by linear motors.

FIG. 18A shows a speed curve when the speed curve of FIG. 17A is the speed governing value, the guide shaft 322B provided with the springs 327A and 327B of FIG. 15 is used, and the wafer table 320 is accelerated to a constant speed. FIG. 18B shows the thrust of the wafer table 320 and thrust generated by the linear motors 323A, 324A and 323B, 324B. In FIG. 18B, the horizontal axis is time t (s), and the vertical axis is thrust F(N). The curve A in a solid line is the thrust added to the wafer table 320, and the curve B in the single-dot chain line shows the thrust of the linear motors 323A and 323B. The spring constant of the springs 327A and 327B is 1,000 N/m, and this is 40% of an ideal spring constant (2,500 N/m). By using the springs 327A and 327B, the heating amount of the linear motors 323A, 324A and 323B, 324B can be reduced to approximately 35% of the heating amount of the case when an elastic body is not used.

Figure 19A:
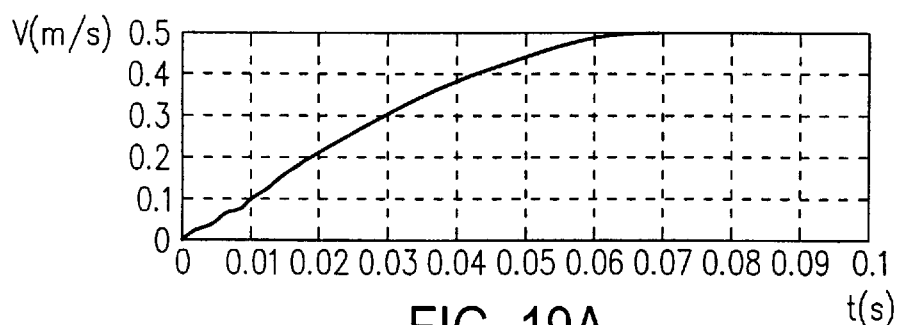
FIG. 19A is a diagram showing a speed curve when a wafer table is accelerated to a constant speed when a guide axis with springs in which a spring constant is the optimum value is used.
Figure 19B:
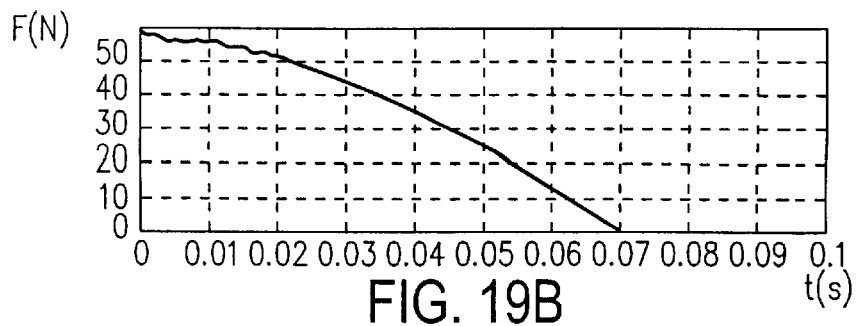
FIG. 19B is a diagram showing thrust of the wafer table.

FIG. 19A shows a speed curve when the wafer table 320 is accelerated to a constant speed using a guide shaft 322B with springs 327A and 327B with the optimum spring constant value of 2,500 N/m. FIG. 19B shows the thrust F of the wafer table 320 at that time. The heating amount of the linear motors 323A, 324A and 323B, 324B can be reduced to 1% or less of the case when an elastic body is not used. Thus, by having the springs 327A and 327B at both ends of the guide shaft 322B, the heating amount of the linear motors 323A, 324A and 323B, 324B can be reduced when the wafer table 320 constantly moves.

However, in the case of the still-positioning of the wafer table 320 at the end of the guide shaft 322B, the linear motors 323A, 324A and 323B, 324B need to generate a thrust that can be balanced with the resistance of the springs 327A and 327B, which causes the heating amount of the linear motors 323A, 324A and 323B, 324B to increase.

Figure 20:
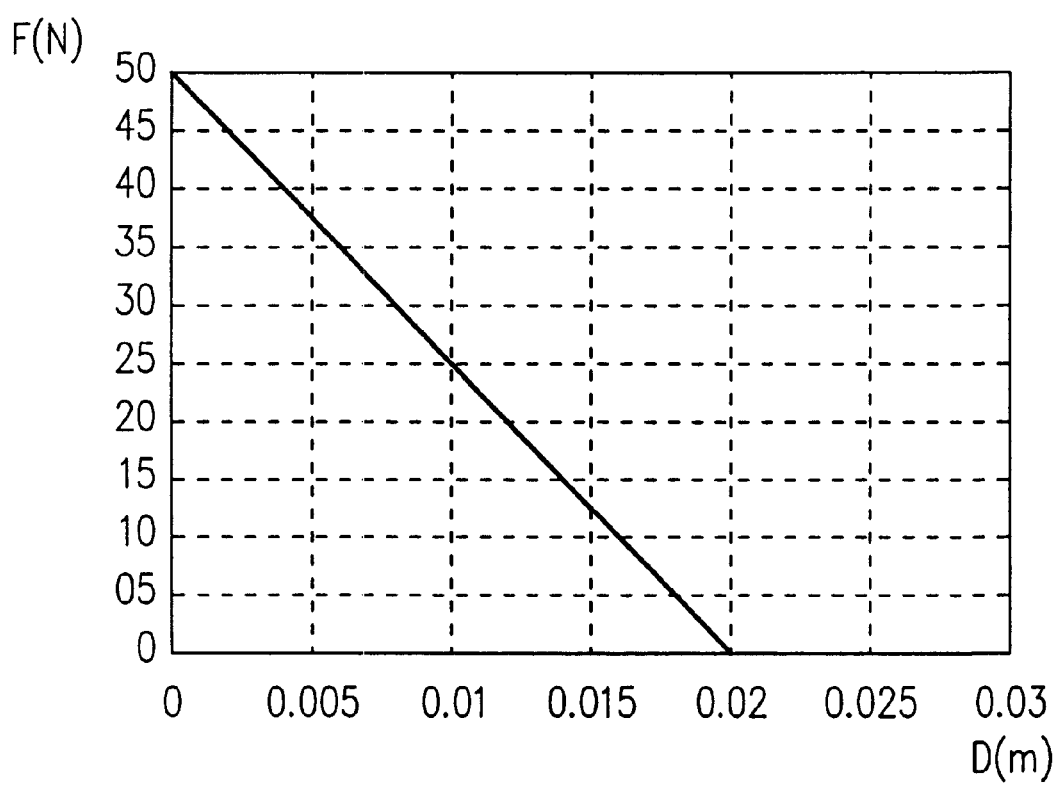
FIG. 20 is a diagram showing the resistance of the springs at the ends of a guide axis with springs.

FIG. 20 shows the resistance of the springs 327A and 327B at the end of the guide shaft 322B provided with the springs 327A and 327B. In FIG. 20, the horizontal axis shows distance D(m) from the end of the guide shaft 322B, and the vertical axis shows the resistance $F_P$(N) of the springs 327A and 327B. In order to still-position the wafer table 320 at the end of the guide shaft 322B, the linear motors 323A, 324A and 323B, 324B need to generate a thrust (50 N) that is large enough to balance the resistance of the springs 327A and 327B. Otherwise, the heating amount increases. Therefore, in this case, a magnetic member is fixed to the end of the guide shaft 322B. Preferably, the heating amount is reduced when the wafer table 320 is still-positioned by using the attractive force of the magnet member.

Figure 21A:
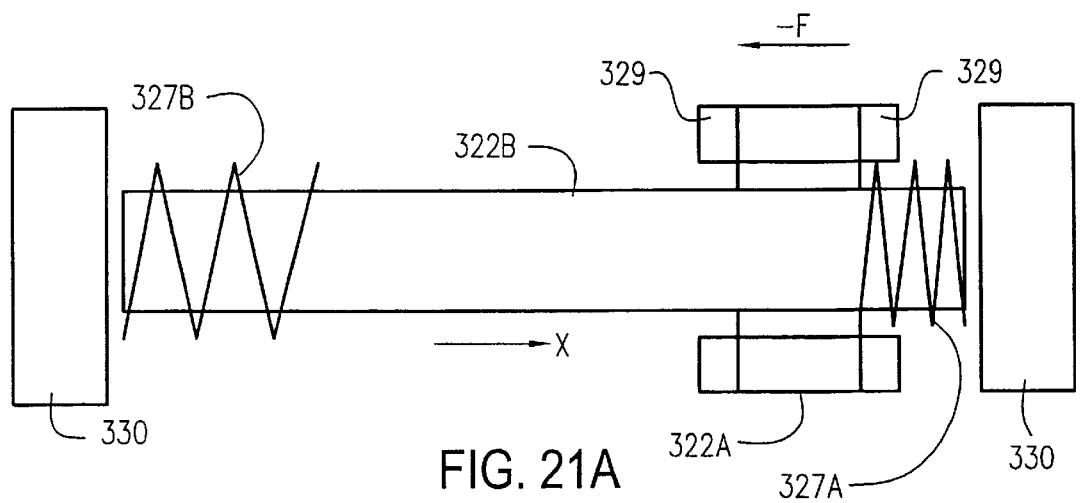
FIGS. 21A–C are schematic diagrams that accompany the explanation of the operation of the guide member and the guide shaft when a magnetic member is further provided.
Figure 21B:
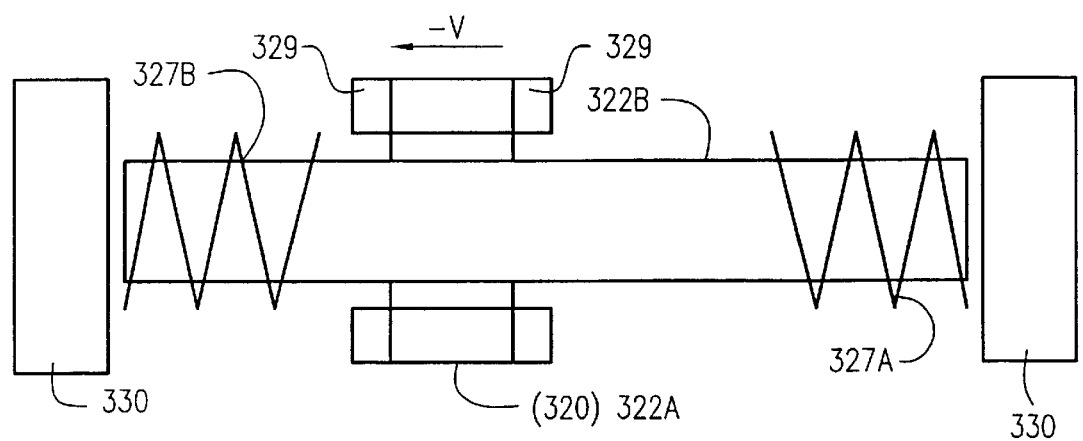
Figure 21C:
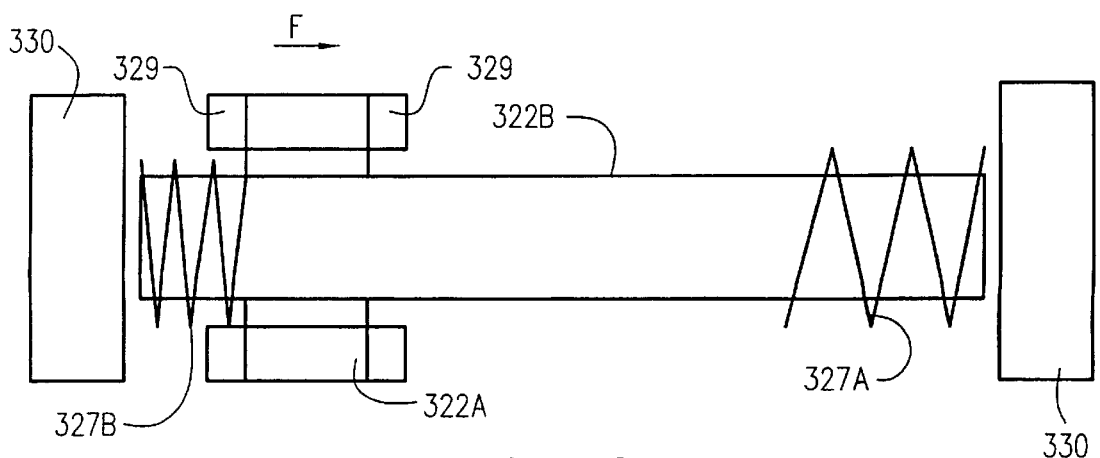

FIGS. 21A–C show the guide member 322A and the guide shaft 322B to which the magnetic member is fixed, corresponding to FIGS. 15A–C. In FIGS. 21A–C, steel plates 329 are fixed to both ends of the guide member 322A, and magnets 330 are fixed at both ends of the guide shaft 322B. As shown in FIGS. 21A–C, when the wafer table 320 is still-positioned at the end of the guide shaft 322B via the guide member 322A, by using the attraction of the steel plate 329 and the magnet 330, the thrust of the linear motors 323A, 324A and 323B, 324B needed against the resistance of the springs 327A and 327B can be reduced and the heating amount can be controlled. Furthermore, in the case of moving the wafer table 320 at a constant velocity, as shown in FIG. 21B, by using the resistance of the springs 327A and 327B, the heating amount of the linear motors 323A, 324A, and 323B, 324B is reduced. In this case, the heating amount of the linear motors can be reduced to approximately ⅙ of the case when a spring or the like is not used on the guide shaft 322B. Additionally, when there is no limitation to the thrust of the linear motors, the potential energy at both ends of the guide shaft 322B can be set at 0. Furthermore, the setting relationship between the steel plates 329 and the magnets 330 can be reversed, and it is acceptable to dispose anything that generates attractive force opposing the resistance of the elastic member of the springs 327A and 327B or the like at the ends of the guide shaft 322B.

Figure 22A:
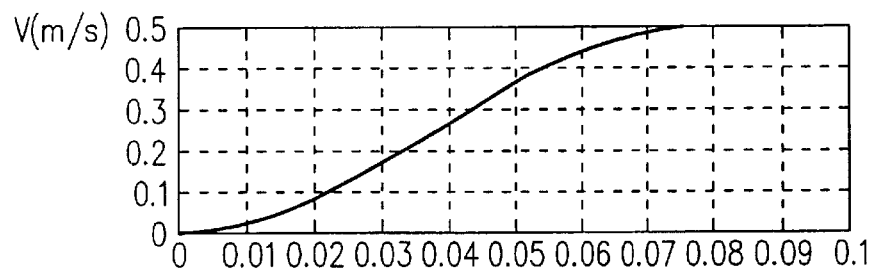
FIG. 22A is a diagram showing speed that is calculated assuming the case where an ideal wafer table without vibration is accelerated to a constant speed on a guide axis provided with springs, steel plates, and magnets.
Figure 22B:
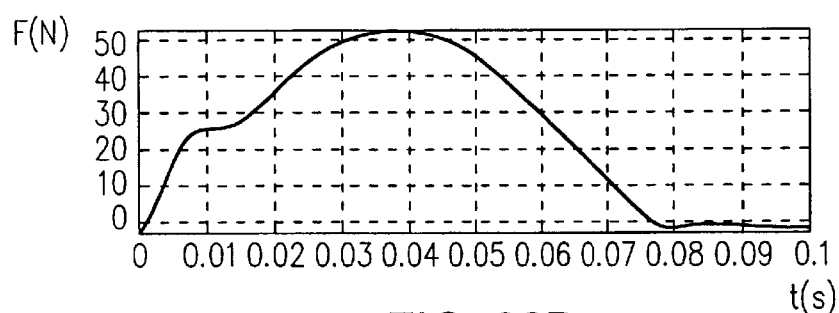
FIG. 22B is a diagram showing thrust of linear motors calculated assuming the case where a wafer table with vibration is controlled taking the speed curve of FIG. 22A as a speed governing value.
Figure 23A:
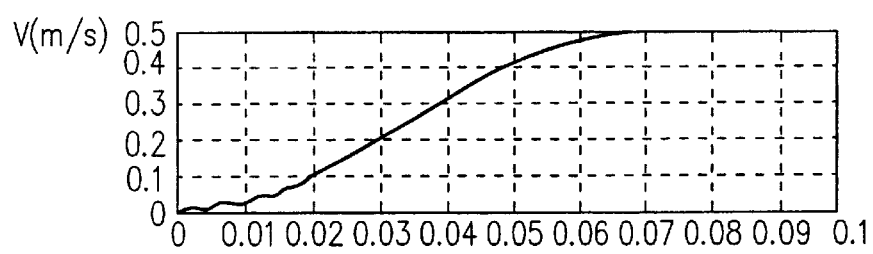
FIG. 23A is a diagram showing the speed curve when a wafer table on a guide axis with steel plates and magnets is accelerated to a constant speed, taking the speed curve of FIG. 22A as a speed governing value.
Figure 23B:
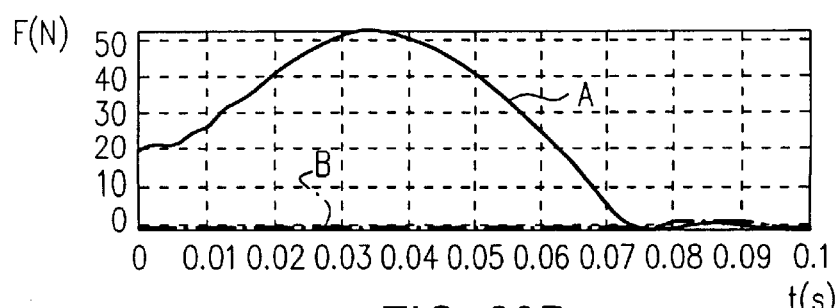
FIG. 23B is a diagram showing thrust of the wafer table at that time, and the thrust of linear motors.

FIG. 22A shows a speed curve that is calculated assuming the case where an ideal wafer table 320 without vibration is accelerated to a constant speed on a guide shaft 322B provided with springs, steel plates, and magnets. In FIG. 22A, the horizontal axis is time t(s), and the vertical axis is moving speed V(m/s) of the wafer table 320. FIG. 22B shows a thrust of the linear motors 323A, 324A and 323B, 324B calculated assuming the case where the wafer table 320 that resonates is controlled with the speed curve of FIG. 22A as the speed governing value. In FIG. 22B, the horizontal axis is time t(s), and the vertical axis is thrust F(N) of the linear motors. FIG. 23A shows a speed curve when the speed curve of FIG. 22A is the speed governing value and the wafer table 320 is accelerated to a constant speed on the guide axis 322 provided with the steel plates 329 and the magnets 330. FIG. 23B shows the thrust F (curve A in solid line) that is added to the wafer table 320 at that time, and the thrust F (curve B in single-dot chain line) of the linear motors 323A, 324A and 323B, 324B. The spring constant of the springs 327A and 327B is 2,000 N/m, which is the optimum spring constant. The heating amount of the linear motors 323A, 324A and 323B, 324B in this case is 1% or less of the case when springs, magnets, and steel plates are not used. Furthermore, compared to the case where a magnet or the like is not provided, the thrust required at the start of moving is small and the wafer table 320 is gradually accelerated, so there is an advantage such that the mechanical resonance of the wafer table 320 can be eased.

Figure 24:
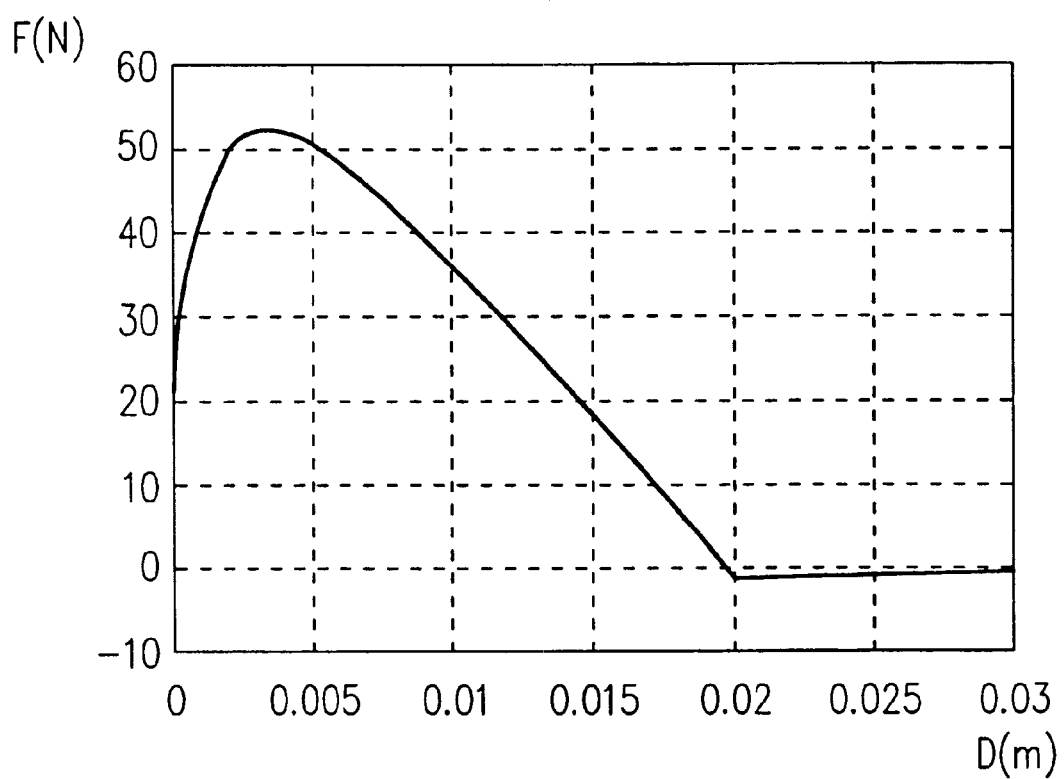
FIG. 24 is a diagram showing the resultant force between the resistance of the spring and the attraction between the magnet and the steel plate at an end of the guide axis to which the steel plate and the magnet are fixed.

FIG. 24 shows the resultant force $F_p(N)$ between the resistance of the springs 327A and 327B and the attraction between the magnet 330 and the steel plate 329 at an end of the guide shaft 322B to which the steel plate 329 and the magnet 330 are fixed according to FIG. 20. In FIG. 24, the horizontal axis is distance D(m) from the end of the guide shaft 322B. As the magnet 330 is fixed to the end of the guide shaft 322B, and the steel plate 329 is fixed to the guide member 322A, the thrust of the linear motors 323A, 324A and 323B, 324B required for the still-positioning of the wafer table 320 at the end of the guide shaft 322B can be reduced and the heating amount can be controlled.

Next, the structure of the support legs 331A–331C that support the wafer table 320 with respect to the wafer base 307 of the exposure apparatus of this example is explained.

Figure 25B:
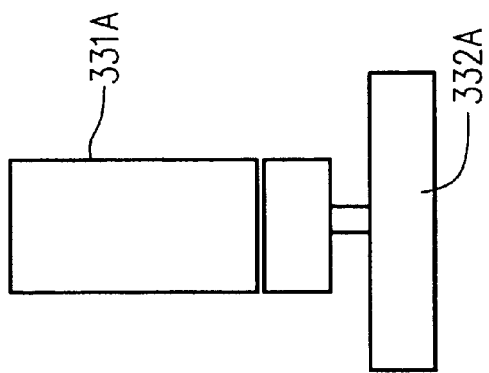
FIG. 25B is a side view of FIG. 25A.
Figure 25A:
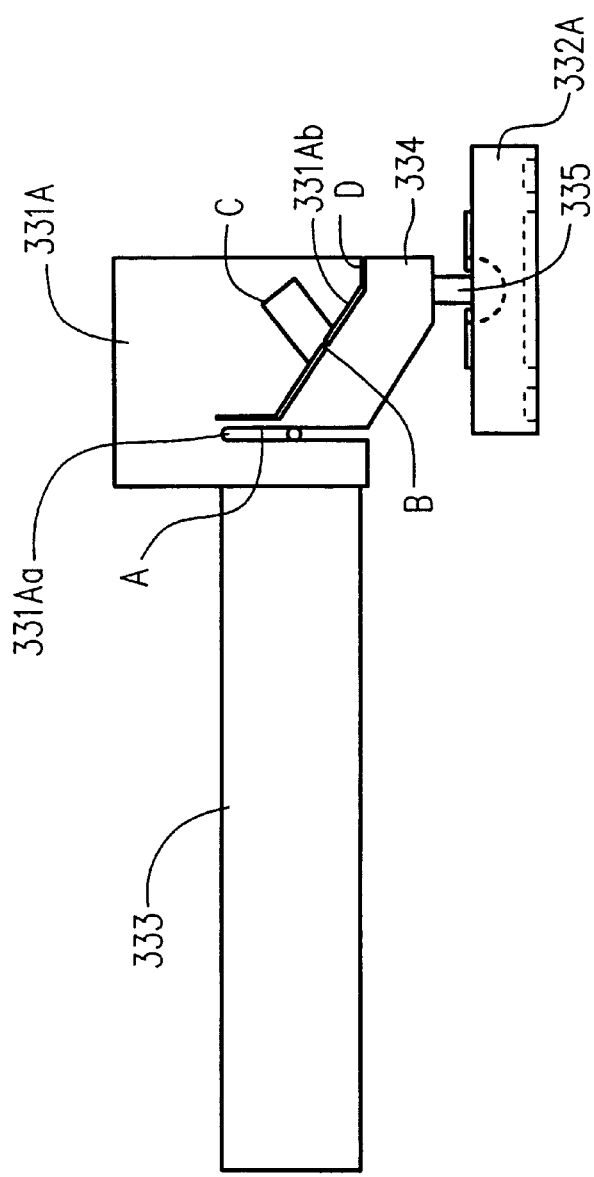
FIG. 25A is a schematic diagram showing a support leg that supports a wafer table, and the vicinity thereof, by enlargement.

FIG. 25A is an enlarged view showing the support leg 331A and the like of the wafer table 320. FIG. 25B is a side view. In the support leg 331A, between slot 331Aa and a lower slot 331Ab is a displacement part 334. A fluid bearing 332A is attached to the bottom of the displacement part 334 through a spherical bearing 335 so that it can be rotated. In the same manner, as shown in FIG. 13, fluid bearings 332B and 332C are fixed to the other support legs 331B and 331C. The fluid bearing 332A is disposed on the wafer base 307 of FIG. 13 by a hydrostatic pressure fluid bearing method. Additionally, as shown by the support leg 331B of FIG. 13C, piezoactuators 333 are fixed to the support legs 331A–331C, and the piezoactuators 333 are fixed to the wafer table 320 via fixing members 353.

Referring to FIGS. 25A–B, a displacement enlargement mechanism that can be extended and retracted in the direction of support is structured by the piezoactuator 333 and the displacement part 334. The fluid bearing 332A has a magnet or a vacuum absorption part for applying pressure. In general, because the displacement by the piezoactuator is only approximately 60 μm, a displacement enlargement mechanism is needed. The displacement enlargement mechanism of this example uses a parallel motion link. When the extending/retracting part of the piezoactuator 333 presses an input point A of the slot 331Aa of the support leg 331A, the input point A is linearly displaced in the horizontal direction by a minute displacement area. Then, point B of the link mechanism part of the displacement part 334 of the displacement enlargement mechanism is rotated about center point C, and point D is displaced in a vertical direction as a result thereof. In the displacement part 334 of the displacement enlargement mechanism of this example, the slope of the link is 26.6°, the displacement enlargement percentage becomes double, and it can be displaced to a maximum of 120 μm. Furthermore, by adjusting the displacement of the displacement part 334 of the support legs 331A–331C, correction of the tilt angle (leveling) of the wafer table 320 and the correction of the position in the vertical direction (focus adjustment) with respect to the wafer base 307 are performed.

Furthermore, even if the support legs 331A–331C are displaced 120 μm, which is the maximum displacement amount, if focus adjustment and leveling cannot be appropriately performed, the front surface positioning of the wafer 303 is premeasured before the exposure starts, and the elevator driving part 308 of FIG. 11 is driven and the wafer base 307 is positioned so that the position of the surface of the wafer 303 can be placed at a specified position (the image plane of the projection optical system 302). After that, focus adjustment and leveling are performed by adjusting the support legs 331A–331C.

FIG. 26 is a block diagram showing a structure of a controller that controls the reticle stage 304 and the wafer stage 305. In FIG. 26, the main controller 350 supplies the desired value of the displacement amount to a desired position in the X and Y directions of the wafer table 320 of the wafer stage 305 and the Z direction of the support legs 331A–331C to the subtractors 361 and 362, respectively. Based upon the value corresponding to a value that is multiplied by −¼ of the measured value, from the desired position in the subtractor 361 of the laser interferometers 318X and 318Y in the converter 365, the wafer stage controller 325 drives the wafer stage 305. The subtractor 362 adds a value obtained by integrating the speed in the Z direction of the wafer base 307, which is measured by the speed sensor 336B, to the desired value, and further supplies a value obtained by subtracting a defocus amount of the wafer stage 305, which is measured by an autofocus sensor, not depicted, to a support leg controller 363. The support leg controller 363 controls the extending or retracting amount of the support legs 331A–331C, which support the wafer stage 305 based upon the supplied value, and focus adjustment and leveling can be performed. Furthermore, the reticle stage controller 352 controls the reticle stage 304, based upon the detection result of the vibration component (yawing) of the projection optical system 302 in the rotational direction about the optical axis and the displacement of the wafer base 307 in the direction perpendicular to the scanning direction detected by the speed sensor 336A, and on the value corresponding to the measured value of the laser interferometers 318X and 318Y subtracted from the output of the converter 365 using the subtractor 366. Thus, the effects of vibration of the wafer base 307 in the horizontal direction can be reduced. Furthermore, the vibration of the wafer base 307 in the Z direction can be reduced by a visco-elastic body 364.

Next, the wafer carrier mechanism of the exposure apparatus of this example is explained. In FIG. 11, in front of the wafer base 307, a carrier base 345 is disposed via a vibration control table 351. A wafer carrier mechanism such as wafer carrier arms 340A and 340B and the wafer cassette 348 and/or the like are disposed on the carrier base 345.

Figure 27A:
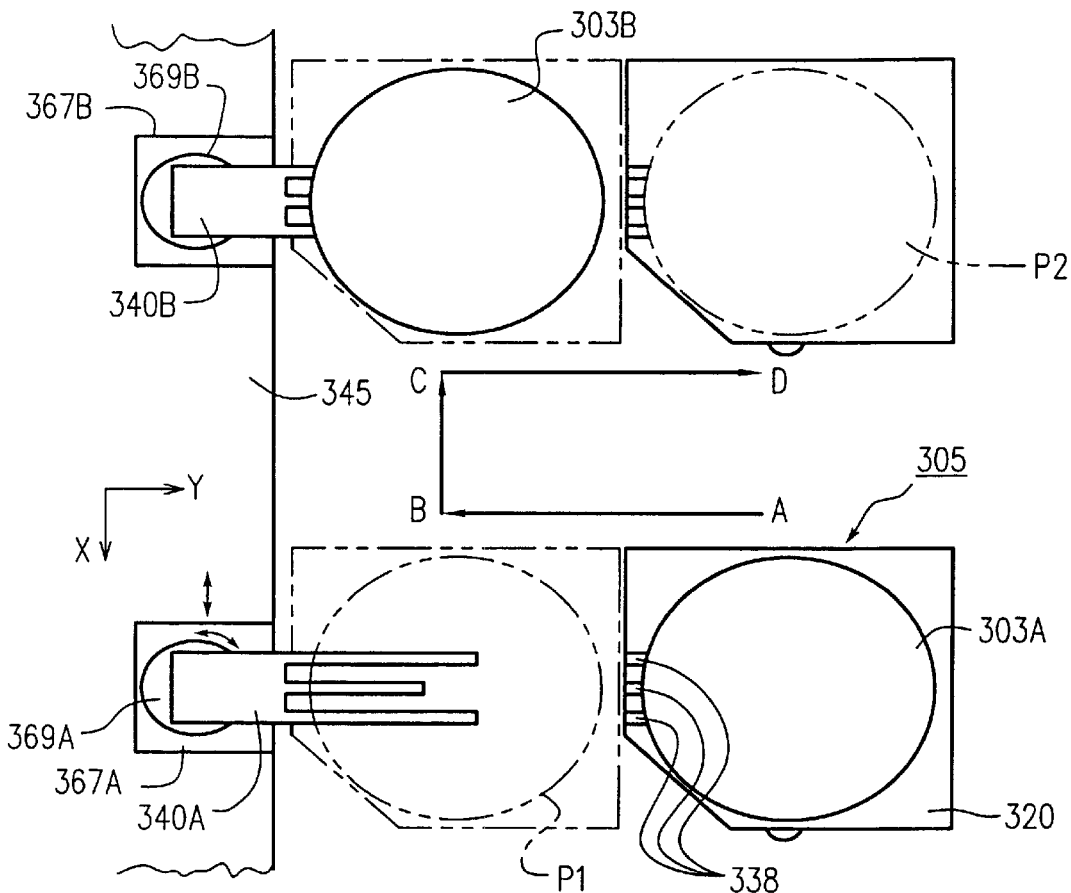
FIGS. 27A–B are diagrams explaining the operation of the wafer stage when a wafer is carried into or out from an exposure device.
Figure 27B:
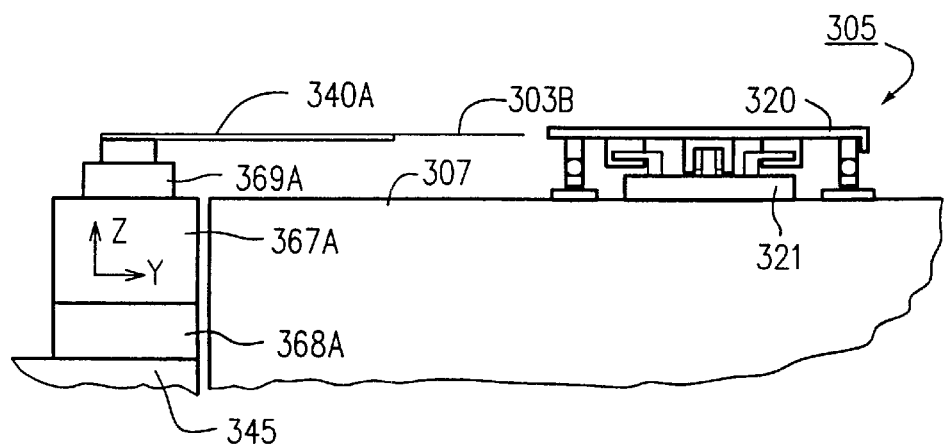

FIG. 27A is a plan view showing part of the wafer carrier mechanism of the exposure apparatus of this example. FIG. 27B is a side view. First, the wafer stage 305 on which is disposed a wafer 303A to which exposure has been completed moves from the exposure completion position A to the wafer carrier position B, and the wafer 303A moves to the position P1. At this time, three fingers of the wafer carrier arms 340A are inserted into spaces which are surrounded by the wafer 303A and the deep grooves 338 of the wafer table 320, and do not contact the wafer table 320. The wafer carrier arm 340A is attached on the support part 367A via an actuator 369A that can be extended and retracted in the Z direction and that can be rotated, and the support part 367A moves on the carrier base 345 by a driving part 368A. A support part 367B, an actuator 369B, and a driving part (not depicted) are provided on another wafer carrier arm 340B as well. When the wafer stage 305 is still, the wafer table 320 releases the fixation of the wafer 303A by vacuum absorption, and the wafer carrier arm 340A vacuum-absorbs the wafer 303A and is raised by the actuator 369A. Furthermore, a wafer 303A to which exposure has been completed is collected to the wafer cassette 348 shown in FIGS. 28A–B.

When the wafer carrier arm 340A raises, the wafer stage 305 simultaneously moves at high speed to below the wafer carrier arm 340B (wafer carry-in position C) which holds a non-exposed wafer 303B. When the wafer table 320 of the wafer stage stops, the wafer carrier arm 340B is lowered by the actuator 369B, and the non-exposed wafer 303B is disposed on the wafer table 320 and is vacuum-absorbed. At this time, because the wafer carrier arm 340B is also inserted into the deep grooves 338, it does not contact the wafer table 320. After this, the wafer stage 305 moves at high speed from the wafer carrier-in position C to the exposure start position D, the wafer 303B moves to the position P2, and exposure begins. At the same time, the wafer carrier arm 340B takes a new wafer out from the wafer cassette 348 of FIGS. 28A–B and waits.

When superposition exposure is performed, the rotational angle of the wafer of the exposure object is measured in advance and the wafer table 320 is rotated during the positioning so as to cancel the angle of the wafer stage 305 at the wafer carrier position C. By doing this, when the wafer table 320 is facing in the scanning direction, a pattern that is formed in a shooting area that is already arrayed in a grid state on the wafer and a pattern image of the reticle 301 can be in a specified positional relationship.

Figure 28A:
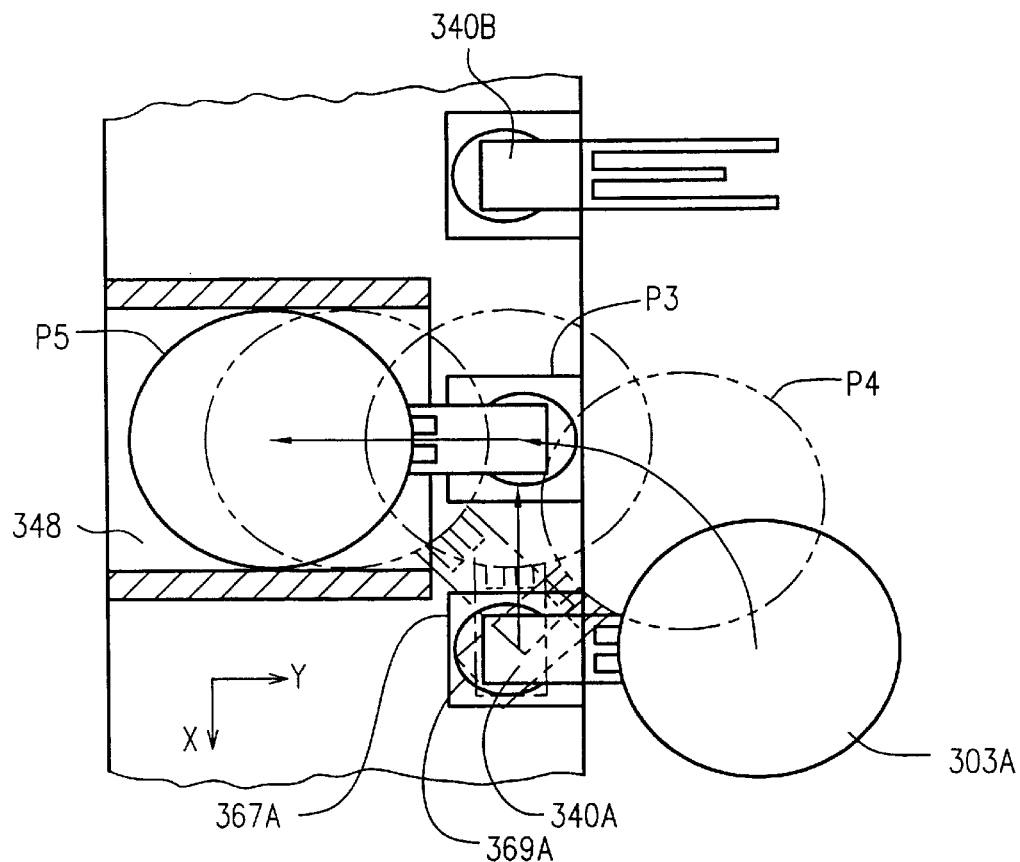
FIGS. 28A–B are diagrams explaining the operation of a wafer carrier arm when an already-exposed wafer is carried out from an exposure device.
Figure 28B:
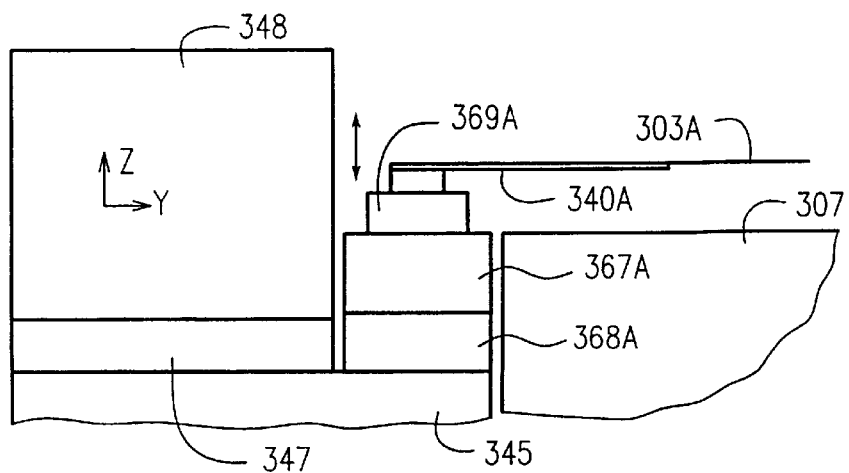

FIG. 28A is a plan view showing the vicinity of the wafer cassette 348 when a wafer is carried out. FIG. 28B is a side view of FIG. 28A. The wafer carrier arms 340A and 340B can be freely driven in three directions such as a rotational direction about the Z-axis, a scanning direction (X direction), and a vertical direction (Z direction). A wafer cassette support member 347 that supports the wafer cassette 348 on the carrier base 345 can be freely driven in the vertical direction. When an already-exposed wafer 303A is collected to the wafer cassette 348, first, the wafer carrier arm 340A that holds the wafer 303A is revolved by the actuator 369A. At the moment the wafer 303A goes through the position P4 and reaches the front surface of the wafer cassette 348, the support member 367A of the wafer carrier arm 340A linearly moves to the position P3 in the X-axis direction and the wafer carrier arm 340A is revolved at the same time so that the wafer 303A linearly moves in the Y-axis direction. Next, when the wafer 303A reaches a predetermined position within the wafer cassette 348, vacuum absorption by the wafer carrier arm 340A is released, and the wafer cassette support member 347 raises and lifts up the wafer 303A. Then, the wafer carrier arm 340A performs an opposite operation compared to the previous process and withdraws.

Figure 29A:
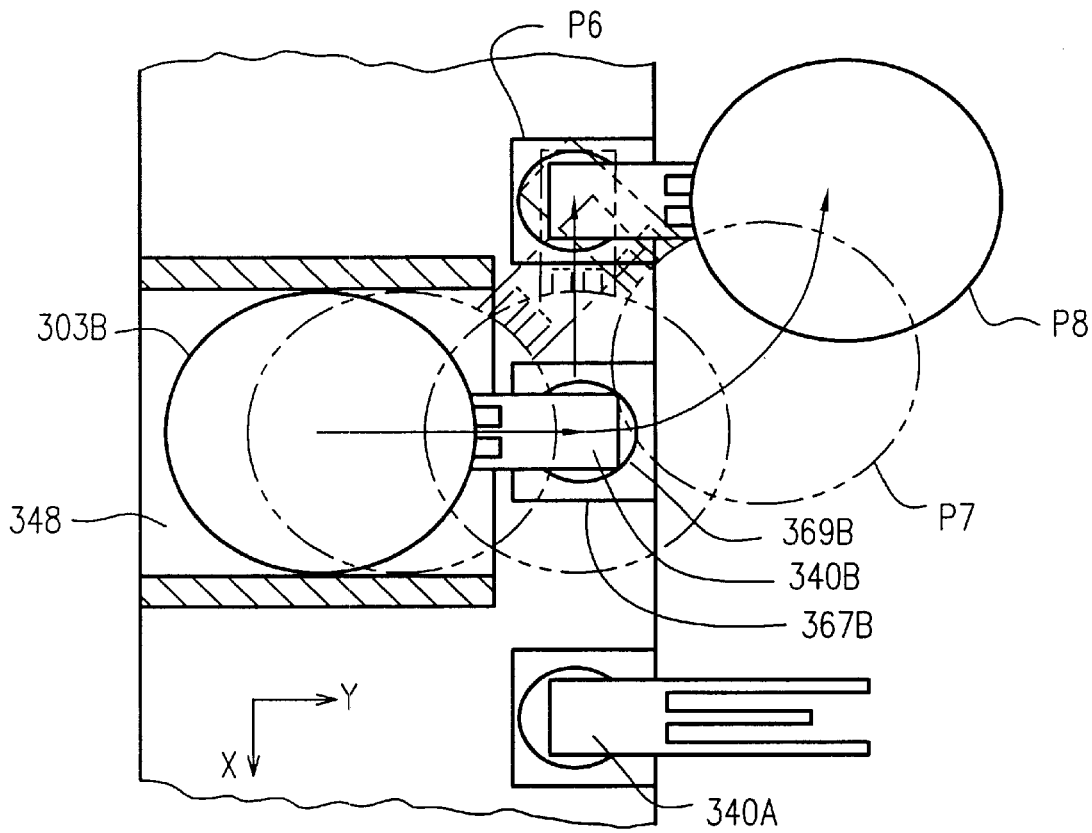
FIGS. 29A–B are diagrams explaining the operation of a wafer carrier arm when a non-exposed wafer is carried into an exposure device.
Figure 29B:
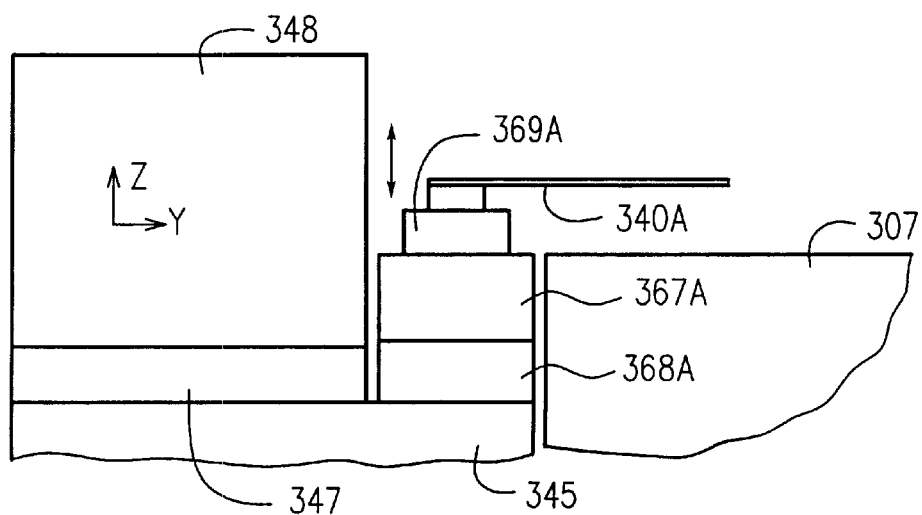

FIG. 29A is a plan view showing the vicinity of the wafer cassette 348 when the wafer is carried in. FIG. 29B is a side view of FIG. 29A. When the wafer is carried out from the wafer cassette 348, first the wafer carrier arm 340B moves below the non-exposed wafer 303B. When the wafer carrier arm 340B stops, the wafer cassette support member 347 lowers, and the wafer 303B is disposed on the wafer carrier arm 340B. Then, after the wafer carrier arm 340B vacuum-absorbs the wafer 303B, the support member 367B of the wafer carrier arm 340B linearly moves in the X-axis direction, the wafer carrier arm 340B is revolved by the actuator 369B and takes the wafer 303B out from the wafer cassette 348. It then waits until the wafer stage 305 arrives. Furthermore, the wafer carrier arm 340B can linearly move parallel to the front surface of the device, so it is also possible to structure the device in-line with surrounding devices such as a coater or a developer.

Thus, as the wafer stage 305 of FIG. 27 moves to the position of carrying out the wafer or the position of carrying in the wafer, it is not necessary to temporarily fix and support the wafer as in a conventional exposure apparatus, and there is no need for receiving and giving the wafer between wafer carrier arms. Therefore, the probability of foreign objects attaching to the wafer and the probability of carrier error can be reduced. Furthermore, a larger mass wafer can be carried and a larger size of wafer can be developed, compared to when the wafer is carried to the exposure position by wafer carrier arms, because the effects of vibration of the wafer carrier arms are not easily received due to the mass of the wafer.

While the present invention has been described with reference to preferred embodiments thereof, it is to be understood that the invention is not limited to the disclosed embodiments or constructions. To the contrary, the invention is intended to cover various modifications and equivalent arrangements. In addition, while the various elements of the disclosed invention are shown in various combinations and configurations, which are exemplary, other combinations and configurations, including more, less or only a single element, are also within the spirit and scope of the invention.

What is claimed is:

1. A scanning exposure apparatus that exposes a pattern of a mask onto an object while a guideless stage that holds said mask is moved in a scanning direction, comprising:
   an exposure device disposed between said mask and said object to expose said pattern onto said object;
   a first drive device connected to said guideless stage to move said guideless stage in the scanning direction with an electromagnetic force; and
   a correction device coupled to said guideless stage that corrects yaw rotation of said guideless stage.

2. An exposure apparatus according to claim 1, wherein said first drive device comprises a linear motor.

3. An exposure apparatus according to claim 1, wherein said correction device is connected to said first drive device.

4. An exposure apparatus according to claim 1, further comprising a position detector that detects a position of said stage.

5. An exposure apparatus according to claim 4, wherein said correction device effects the correction based on a detection result of said position detector.

6. An exposure apparatus according to claim 4, wherein said position detector comprises an interferometer system.

7. An object on which a pattern has been exposed utilizing the scanning exposure apparatus of claim 1.

8. An exposure apparatus according to claim 1, wherein the correction device corrects the yaw rotation with an electromagnetic force.

9. An exposure apparatus according to claim 1, wherein the first drive device has a coil member and a magnet member, the coil member being connected to the guideless stage.

10. A scanning exposure apparatus that exposes a pattern of a mask onto an object while a guideless stage that holds said mask is moved in a scanning direction, comprising:
    means for exposing said pattern onto said object;
    first moving means for moving said guideless stage in the scanning direction with an electromagnetic force; and
    means, coupled to said guideless stage, for adjusting yaw rotation of said guideless stage.

11. A method of making a scanning exposure apparatus that exposes a pattern of a mask onto an object while a guideless stage that holds said mask is moved in a scanning direction, comprising the steps of:
    providing an exposure device between said mask and said object to expose said pattern onto said object;
    providing a first drive device connected to said guideless stage to move said guideless stage in the scanning direction with an electromagnetic force; and
    providing a correction device coupled to said guideless stage that corrects yaw rotation of said guideless stage.

12. A method according to claim 11, wherein said first drive device comprises a linear motor.

13. A method according to claim 11, wherein said correction device is connected to said first drive device.

14. A method according to claim 11, further comprising providing a position detector that detects a position of said stage.

15. A method according to claim 14, wherein said correction device effects the correction based on a detection result of said position detector.

16. A method according to claim 14, wherein said position detector comprises an interferometer system.

17. An object on which a pattern has been exposed utilizing the scanning exposure apparatus made by the method of claim 11.

18. A method according to 11, wherein the correction device corrects the yaw rotation with an electromagnetic force.

19. A method according to claim 11, wherein the first drive device has a coil member and a magnet member, the coil member being connected to the guideless stage.

20. A method of exposing a pattern of a mask onto an object while a guideless stage that holds said mask is moved in a scanning direction utilizing a scanning exposure apparatus, comprising the steps of:
    moving said guideless stage in the scanning direction with electromagnetic force;
    adjusting yaw rotation of said guideless stage with a correction device couples to said guideless stage; and
    exposing said pattern onto said object.

21. A method according to claim 20, wherein said guideless stage is moved by a first drive device having a linear motor.

22. A method according to claim 21, wherein said correction device is connected to said first drive device.

23. A method according to claim 20, further comprising detecting a position of said guideless stage with a position detector.

24. A method according to claim 23, wherein said correction device effects the correction based on a detection result of said position detector.

25. A method according to claim 23, wherein said position detector comprises an interferometer system.

26. A method according to claim 20, wherein the correction device corrects the yaw rotation with an electromagnetic force.

27. A method according to claim 20, wherein the guideless stage is moved by a coil member and a magnet member, the coil member being connected to the guideless stage.

* * * * *